United States Patent
Oohashi et al.

(10) Patent No.: US 7,443,158 B2
(45) Date of Patent: Oct. 28, 2008

(54) SENSOR, AND METHOD FOR MEASURING PHYSICAL QUANTITY BY USE OF THE SENSOR

(75) Inventors: Toshiyuki Oohashi, Kakegawa (JP); Tamito Suzuki, Fukuroi (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 11/236,680

(22) Filed: Sep. 28, 2005

(65) Prior Publication Data

US 2006/0066303 A1   Mar. 30, 2006

(30) Foreign Application Priority Data

Sep. 28, 2004   (JP)   ............................. 2004-281194

(51) Int. Cl.
*G01B 7/14* (2006.01)
*G01R 33/00* (2006.01)
*G01P 15/105* (2006.01)

(52) U.S. Cl. ................. 324/207.22; 324/260; 73/514.31

(58) Field of Classification Search ................. 324/244, 324/247, 249, 251, 252, 260, 207.21, 207.26; 73/514.01, 514.16, 514.31

See application file for complete search history.

(56) References Cited

U.S. PATENT DOCUMENTS

| | | | | |
|---|---|---|---|---|
| 5,030,910 A | * | 7/1991 | Junge et al. ............. | 324/207.15 |
| 5,763,783 A | * | 6/1998 | Asada ....................... | 73/514.31 |
| 6,131,457 A | * | 10/2000 | Sato ......................... | 73/514.31 |
| 6,494,092 B2 | * | 12/2002 | Ueyanagi et al. .............. | 73/493 |
| 6,904,805 B2 | * | 6/2005 | Joseph et al. ............ | 73/514.38 |
| 2002/0017134 A1 | * | 2/2002 | Sakurai et al. ........... | 73/504.02 |

FOREIGN PATENT DOCUMENTS

JP   2003-172633 A   6/2003

* cited by examiner

*Primary Examiner*—Kenneth J Whittington
(74) *Attorney, Agent, or Firm*—Dickstein Shapiro LLP

(57) ABSTRACT

A sensor includes a first X-axis GMR element to a fourth X-axis GMR element fixed on a substrate, and a movable coil movably supported on the substrate. When electric current flows through the movable coil, a magnetic field is generated around the movable coil. The generated magnetic field is applied to the first to fourth X-axis GMR elements. The movable coil moves in accordance with acceleration generated in the sensor. The movement of the movable coil causes variation in the magnetic field applied to the first to fourth X-axis GMR element. While no electric current flows to the movable coil, the sensor measures an external magnetic field on the basis of resistances of the first to fourth X-axis GMR elements. While constant electric current flows through the movable coil, the sensor measures acceleration or the like on the basis of resistances of the first to fourth X-axis GMR elements.

22 Claims, 22 Drawing Sheets

→ ;DIRECTION OF MAGNETIZATION OF FREE LAYER
→ ;DIRECTION OF MAGNETIZATION OF PINNED LAYER $$Vr = VB \cdot (R1-rb)/(2R1+ra-rb)$$

$$Vr = VB \cdot (R1+rd)/(2R1+rd-rc)$$

SENSOR, AND METHOD FOR MEASURING PHYSICAL QUANTITY BY USE OF THE SENSOR

BACKGROUND OF THE INVENTION

1. Field of the Invention

The present invention relates to a sensor capable of measuring not only an external magnetic field but also a physical quantity, such as acceleration, by use of a magnetic detection element, as well as to a method for measuring a physical quantity by use of the sensor.

2. Description of the Related Art

Conventionally, there have been known various sensors capable of measuring an external magnetic field and acceleration. Such a sensor includes a substrate, and a weight section supported thereon via a beam, and is configured such that a plurality of stress-measuring elements measure stress that arises in the beam when acceleration arises in the sensor. The sensor further includes a plurality of Hall elements (magnetic detection elements) fixed on the weight section and is further configured such that, on the basis of outputs from the Hall elements, a magnetic field external of the sensor (external magnetic field) is measured (refer to, for example, Japanese Patent Application Laid-Open (kokai) No. 2003-172633, Paragraph Nos. 0021 to 0034, FIGS. 1 and 2).

However, because of employment of a plurality of stress-measuring elements and a plurality of magnetic detection elements, the above-mentioned conventional sensor becomes expensive and complicated in structure.

SUMMARY OF THE INVENTION

In view of the foregoing, an object of the present invention is to provide an inexpensive sensor having a simple structure and capable of measuring not only an external magnetic field, such as terrestrial magnetism, but also a physical quantity (hereinafter called "acceleration or the like"), such as acceleration or angular acceleration. Another object of the present invention is to provide a method for measuring acceleration or the like by use of the sensor.

A sensor of the present invention comprises a substrate; a magnetic detection element fixed on the substrate and exhibiting a characteristic value whose magnitude corresponds to a magnetic field applied thereto; and a movable coil supported movably on the substrate via a support member and applying to the magnetic detection element a magnetic field generated through application of electric current thereto. The sensor outputs a value corresponding to a characteristic value exhibited by the magnetic detection element. The support member may be elastic, such as a spring-tempered support member.

In this case, the magnetic detection element may be any one of, for example, a giant magnetoresistance element (GMR element), an anisotropic magnetoresistance element (AMR element), a tunnel magnetoresistance element (TMR element), a magnetic impedance element (MI element), a flux gate sensor, and a Hall element. That is, characteristic values exhibited by the magnetic detection element include resistance and voltage. The same also applies to other sensors of the present invention to be described below.

With the sensor of the present invention, when no electric current flows to the movable coil, a characteristic value of the magnetic detection element corresponds to the intensity of a magnetic field (external magnetic field, such as terrestrial magnetism) which is present externally of the sensor and is applied to the magnetic detection element. Accordingly, a value (value; e.g., resistance or voltage, corresponding to a characteristic value exhibited by the magnetic detection element) output from the sensor varies in accordance with the intensity of an external magnetic field.

When electric current flows to the movable coil (when electric current is applied to the movable coil), a magnetic field is generated around the movable coil. The thus-generated magnetic field is applied to the magnetic detection element fixed on the substrate. Further, the movable coil is movably (in relation to the substrate) supported on the substrate via the support member. Accordingly, when acceleration or the like arises in the sensor (in actuality, an object on which the sensor is fixed), associated inertial force causes the movable coil to shift from its initial position (where the movable coil is located when acceleration or the like is absent).

As a result, a relative position between the magnetic detection element and the movable coil varies, causing a variation in "magnetic field applied to the magnetic detection element" which is generated through application of electric current to the movable coil. Accordingly, a characteristic value exhibited by the magnetic detection element varies in accordance with acceleration or the like of the sensor, so that a value output from the sensor also varies in accordance with the acceleration or the like. Thus, by merely using the movable coil and the magnetic detection element, the sensor of the present invention can measure an external magnetic field and acceleration or the like thereof.

A sensor of the present invention comprises a substrate having a main surface; a first magnetic detection element fixed on the main surface of the substrate so as to exhibit a characteristic value whose magnitude corresponds to a component of a magnetic field along a first direction on the main surface of the substrate; and a second magnetic detection element fixed on the main surface of the substrate so as to exhibit a characteristic value whose magnitude corresponds to a component of the magnetic field along a second direction intersecting the first direction at a predetermined angle on the main surface of the substrate. The sensor further comprises a movable coil supported on the substrate via a support member so as to be movable in a plane in parallel with the main surface of the substrate and applying to the first and second magnetic detection elements a magnetic field generated through application of electric current thereto. The sensor is configured so as to output a value corresponding to a characteristic value exhibited by the first magnetic detection element and a value corresponding to a characteristic value exhibited by the second magnetic detection element.

With the sensor of the present invention, when no electric current flows to the movable coil, a characteristic value exhibited by the first magnetic detection element corresponds to the intensity of a component along the first direction (a direction in which the first magnetic detection element detects a magnetic field) of an external magnetic field applied to the sensor, and a characteristic value exhibited by the second magnetic detection element corresponds to the intensity of a component along the second direction (a direction in which the second magnetic detection element detects a magnetic field) of the external magnetic field. The first and second directions are determined in accordance with the coordinate axes on the main surface of the substrate.

Further, in the sensor of the present invention, the first direction and the second direction intersect each other at a predetermined angle. The sensor outputs a value corresponding to a characteristic value exhibited by the first magnetic detection element and a value corresponding to a characteristic value exhibited by the second magnetic detection element. Accordingly, the sensor can measure the direction and intensity of an external magnetic field in a plane in parallel with the main surface of the substrate.

When electric current flows to the movable coil (when electric current is applied to the movable coil), a magnetic field is generated around the movable coil. The thus-generated magnetic field is applied to the first and second magnetic detection elements fixed on the substrate. Further, the movable coil is movably supported on the substrate via the support member. Accordingly, when acceleration or the like arises in a plane in parallel with the main surface of the substrate, associated inertial force causes the movable coil to shift from its initial position.

As a result, a relative position between the first magnetic detection element and the movable coil and/or a relative position between the second magnetic detection element and the movable coil varies, causing a variation in "magnetic field applied to each of the first and second magnetic detection elements", the magnetic field being generated through application of electric current to the movable coil. Accordingly, a characteristic value exhibited by the first magnetic detection element and/or a characteristic value exhibited by the second magnetic detection element varies in accordance with acceleration or the like of the sensor, so that a value output from the sensor also varies in accordance with the acceleration or the like. Thus, by merely using the movable coil and the magnetic detection elements, the sensor of the present invention can measure an external magnetic field and acceleration or the like thereof.

In this case, preferably, the predetermined angle (angle between the first direction and the second direction) is 90 degrees. That is, preferably, the first direction and the second direction intersect each other perpendicularly, so that, when the first direction coincides with the direction of the X-axis of the substrate, the second direction coincides with the direction of the Y-axis of the substrate, the Y-axis perpendicularly intersecting the X-axis.

When the difference in angle between the first direction and the second direction is, for example, small compared to 90 degrees, the second magnetic detection element fails to accurately measure a component of a magnetic field along a direction perpendicularly intersecting the first direction. Needless to say, the first magnetic detection element fails to detect a component of the magnetic field along a direction perpendicularly intersecting the first direction.

By contrast, when the first direction and the second direction intersect each other perpendicularly, the second magnetic detection element can accurately measure a magnetic field along a direction perpendicularly intersecting the first direction. Accordingly, on the basis of a characteristic value of the first magnetic detection element and a characteristic value of the second magnetic detection element as exhibited when no current flows to the movable coil, the direction and intensity of an external magnetic field applied to the sensor can be accurately measured.

A sensor of the present invention comprises a substrate having a main surface; a first magnetic detection element fixed on the main surface of the substrate; and a second magnetic detection element fixed on the main surface of the substrate. The sensor outputs a value corresponding to a characteristic value exhibited by the first magnetic detection element and a value corresponding to a characteristic value exhibited by the second magnetic detection element. The first magnetic detection element is disposed in the vicinity of a central portion of a first side, which is one of sides constituting an imaginary polygon (preferably a regular polygon, more preferably a square) formed on the main surface of the substrate, and is configured so as to exhibit a characteristic value whose magnitude corresponds to a component of a magnetic field along a direction perpendicularly intersecting the first side. The second magnetic detection element is disposed in the vicinity of a central portion of a second side, which is one of sides constituting the imaginary polygon formed on the main surface of the substrate and which intersects the first side, and is configured so as to exhibit a characteristic value whose magnitude corresponds to a component of the magnetic field along a direction perpendicularly intersecting the second side. The sensor further comprises a movable coil having a shape identical with or similar to the imaginary polygon, the movable coil being supported on the substrate via a support member so as to be movable in a plane in parallel with the main surface of the substrate, the movable coil, at the time of the sensor being in a stationary condition, being held in its initial position where a barycenter of the movable coil coincides with that of the imaginary polygon and where sides of the movable coil are in parallel with those of the imaginary polygon, the movable coil applying to the first and second magnetic detection elements a magnetic field generated through application of electric current thereto.

With the sensor of the present invention, on the basis of a characteristic value of the first magnetic detection element and a characteristic value of the second magnetic detection element as exhibited when no current flows to the movable coil, an external magnetic field applied to the sensor can be measured.

A magnetic field generated by electric current flowing through the first side of the movable coil is mainly applied to the first magnetic detection element. The direction of the magnetic field perpendicularly intersects the first side. The first magnetic detection element detects a magnetic field in a direction that perpendicularly intersects the first side of the movable coil. Accordingly, the first magnetic detection element can accurately detect the magnetic field that is formed around the first side through application of current to the movable coil. Similarly, a magnetic field generated by electric current flowing through the second side of the movable coil is mainly applied to the second magnetic detection element. The direction of the magnetic field perpendicularly intersects the second side. The second magnetic detection element detects a magnetic field in a direction that perpendicularly intersects the second side of the movable coil. Accordingly, the second magnetic detection element can accurately detect the magnetic field that is formed around the second side through application of current to the movable coil.

The movable coil is supported on the substrate via the support member so as to be movable in a plane in parallel with the main surface of the substrate. Accordingly, the movable coil moves along the main surface of the substrate in accordance with acceleration or the like of the sensor. This causes a variation in a magnetic field formed around the first side and applied to the first magnetic detection element and a variation in a magnetic field formed around the second side and applied to the second magnetic detection element. Thus, by merely using the movable coil and the first and second magnetic detection elements, the sensor of the present invention can accurately measure an external magnetic field and acceleration or the like thereof.

Preferably, any one of the above-described sensors of the present invention further comprises electric-current control means for controlling electric current flowing through the movable coil. The thus-configured sensor measures an external magnetic field when no electric current is applied to the movable coil, and measures acceleration or the like when electric current is applied to the movable coil.

The present invention provides a method for measuring a physical quantity for measuring, by use of a sensor, at least either acceleration or angular acceleration of the sensor or an object on which the sensor is fixed. The sensor includes a substrate, a magnetic detection element fixed on the substrate and exhibiting a characteristic value whose magnitude corresponds to a magnetic field applied thereto, and a movable coil supported movably on the substrate via a support member. While the movable coil generates a magnetic field through application of electric current thereto, a value corresponding to a characteristic value exhibited by the magnetic detection element is measured as at least either the acceleration or the angular acceleration.

The measuring method of the present invention can measure acceleration or angular acceleration by use of the aforementioned sensor of the present invention that comprises a movable coil and a magnetic detection element.

The present invention provides a measuring method for measuring, by use of a sensor, an external magnetic field applied to the sensor and at least either acceleration or angular acceleration of the sensor or an object on which the sensor is fixed. The sensor includes a substrate, a magnetic detection element fixed on the substrate and exhibiting a characteristic value whose magnitude corresponds to a magnetic field applied thereto, and a movable coil supported movably on the substrate via a support member. The method comprises an external-magnetic-field-measuring step in which, while application of electric current to the movable coil is stopped so as to disappear the magnetic field generated by the movable coil, a value corresponding to a characteristic value exhibited by the magnetic detection element is obtained as the intensity of the external magnetic field applied to the sensor; and a physical-quantity-measuring step in which, while electric current is applied to the movable coil so as to generate the magnetic field by the movable coil, a value corresponding to a characteristic value exhibited by the magnetic detection element is obtained as at least either the acceleration or the angular acceleration.

The measuring method of the present invention can measure an external magnetic field, such as terrestrial magnetism, and acceleration or the like by use of the aforementioned sensor of the present invention.

In this case, preferably, the external-magnetic-field-measuring step and the physical-quantity-measuring step are performed alternately and repeatedly at predetermined time intervals, and the external-magnetic-field-measuring step is started after elapse of an allowance time subsequent to stoppage of application of electric current to the movable coil upon completion of the physical-quantity-measuring step.

For a while subsequent to stoppage of application of electric current to the movable coil, transient current flows through the movable coil, so that a magnetic field generated around the movable coil is not completely extinguished (disappeared). Accordingly, if measurement of an external magnetic field is started immediately after stoppage of application of electric current to the movable coil, the external magnetic field may fail to be properly measured. Therefore, by means of starting the external-magnetic-field-measuring step after elapse of an allowance time subsequent to stoppage of application of electric current to the movable coil, the external magnetic field can be accurately measured.

BRIEF DESCRIPTION OF THE DRAWINGS

Various other objects, features and many of the attendant advantages of the present invention will be readily appreciated as the same becomes better understood by reference to the following detailed description of the preferred embodiment when considered in connection with the accompanying drawings, in which.

DESCRIPTION OF THE PREFERRED EMBODIMENTS

Figure 1:
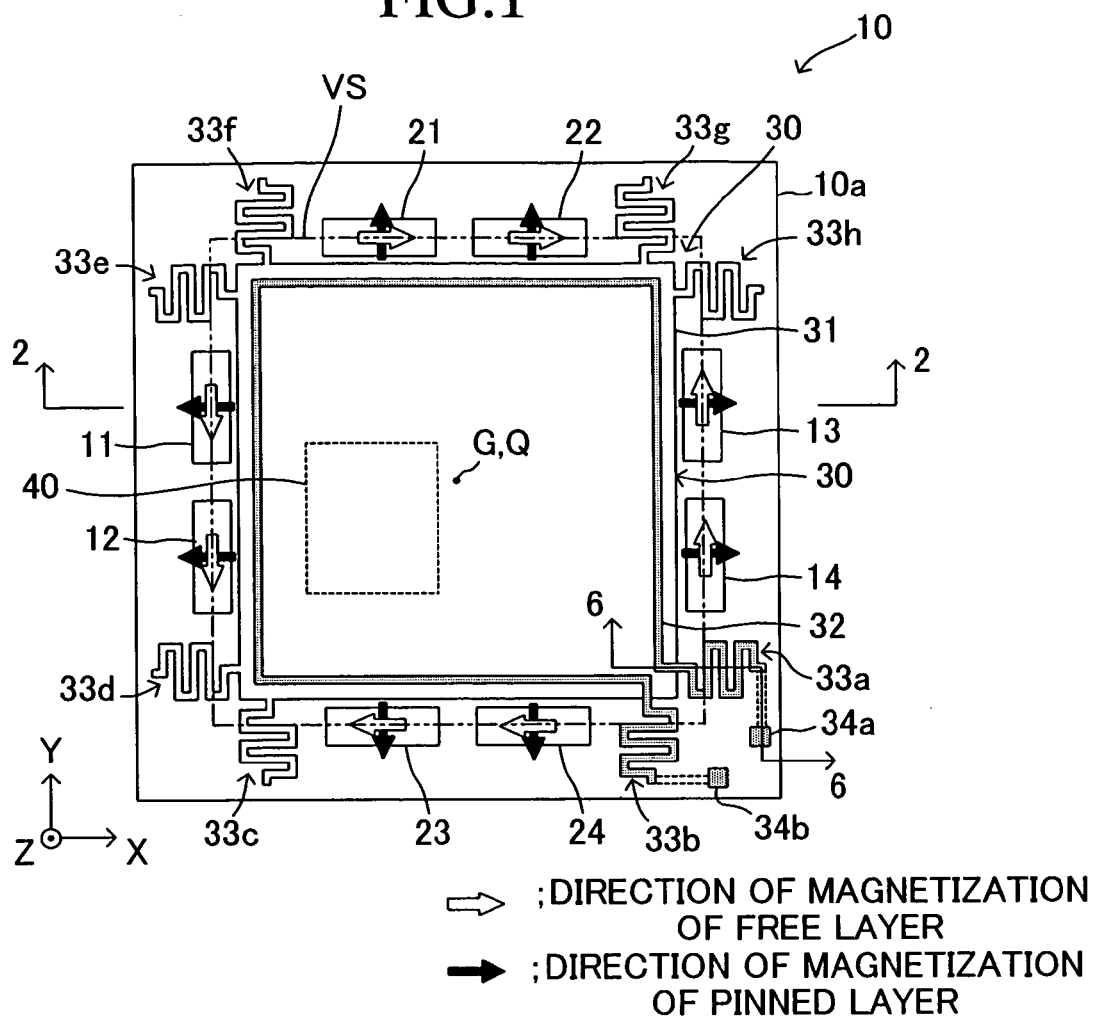
FIG. 1 is a plan view showing an embodiment of a sensor according to the present invention.
Figure 2:
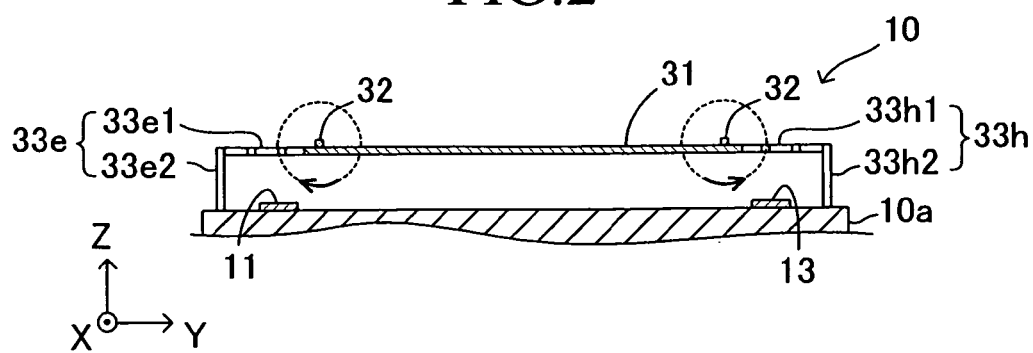
FIG. 2 is a sectional view of the sensor cut by a plane extending along line 2-2 of FIG. 1.

Embodiments of the present invention will next be described in detail with reference to the drawings. An embodiment of a sensor according to the present invention will be first described. FIG. 1 is a plan view of the sensor 10, and FIG. 2 is a sectional view of the sensor 10 cut by a plane extending along line 2-2 of FIG. 1. As shown in FIGS. 1 and 2, the sensor 10 includes a substrate 10$a$, a plurality of (in the present embodiment, a total of eight) GMR elements (magnetic detection elements or magnetoresistance elements) 11 to 14 and 21 to 24, a movable coil section 30, and a circuit section 40.

The substrate 10$a$ is a thin plate that, as viewed in plane, assumes a substantially square shape having sides extending along mutually orthogonal X-axis and Y-axis and that has a small thickness along the Z-axis orthogonal to the X- and Y-axes. The X- and Y-axes are coordinate axes on the main surface (upper surface) of the substrate 10$a$ and are also called the first direction and the second direction, respectively.

The GMR elements 11 to 14 and 21 to 24 are magnetic detection elements. Each of them exhibits a characteristic value whose magnitude corresponds to a magnetic field (a value corresponding to the intensity of a component of a magnetic field along a direction in which the GMR elements each detect a magnetic field, which will be described later). The GMR elements 11 to 14 and 21 to 24 have substantially the same structure, except for arrangement on the substrate 10$a$. Therefore, the structure of the GMR element 11 will be representatively described in brief. Note that the GMR element 11 is called the first X-axis GMR element 11; the GMR element 12 is called the second X-axis GMR element 12; the GMR element 13 is called the third X-axis GMR element 13; and the GMR element 14 is called the fourth X-axis GMR element 14. The GMR element 21 is called the first Y-axis GMR element 21; the GMR element 22 is called the second Y-axis GMR element 22; the GMR element 23 is called the third Y-axis GMR element 23; and the GMR element 24 is called the fourth Y-axis GMR element 24.

In addition, the first X-axis GMR element 11 to the fourth X-axis GMR element 14 can collectively be called the first magnetic detection element that is fixed on the main surface of the substrate 10$a$ so as to exhibit a characteristic value whose magnitude corresponds to a component of a magnetic field along the first direction on the main surface of the substrate 10$a$. The first Y-axis GMR element 21 to the fourth Y-axis GMR element 24 can collectively be called the second magnetic detection element that is fixed on the main surface of the substrate 10$a$ so as to exhibit a characteristic value whose magnitude corresponds to a component of the magnetic field along the second direction intersecting the first direction at a predetermined angle (in the present embodiment, 90 degrees) on the main surface of the substrate 10$a$.

Figure 3:
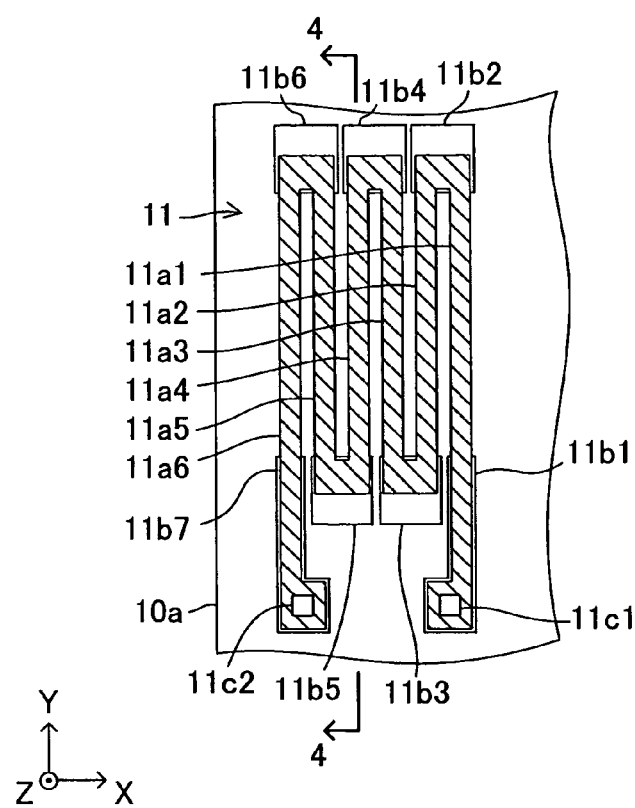
FIG. 3 is a partially enlarged plan view of the first X-axis GMR element shown in FIG. 1.
Figure 4:
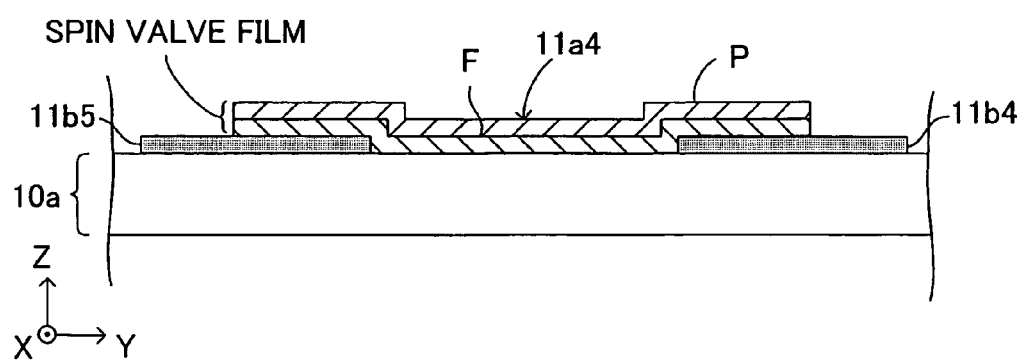
FIG. 4 is a schematic sectional view of the first X-axis GMR element cut by a plane extending along line 4-4 of FIG. 3.

As shown in FIG. 3, which is an enlarged plan view of the first X-axis GMR element 11, and FIG. 4, which is a schematic sectional view of the first X-axis GMR element 11 taken along line 4-4 of FIG. 3, the first X-axis GMR element 11 includes a plurality of (in the present embodiment, six) narrow strip portions 11$a$1 to 11$a$6, a plurality of (in the present embodiment, seven) bias magnet films 11$b$1 to 11$b$7, and a pair of terminal portions 11$c$1 and 11$c$2.

The narrow strip portions 11$a$1 to 11$a$6 have their longitudinal directions along the direction of the Y-axis. The narrow strip portion 11$a$1 is located farthest with respect to the positive direction of the X-axis, and its end portion located toward the negative side along the Y-axis is formed on the bias magnet film 11$b$1. The bias magnet film 11$b$1 is connected to the terminal portion 11$c$1. An end portion of the narrow strip portion 11$a$1 located toward the positive side along the Y-axis is formed on the bias magnet film 11$b$2.

The narrow strip portion 11$a$2 is disposed adjacent to the narrow strip portion 11$a$1 on the negative side thereof along the X-axis. One end portion of the narrow strip portion 11$a$2 is formed on the bias magnet film 11$b$2 and is connected, on the bias magnet film 11$b$2, to the narrow strip portion 11$b$1. The other end portion of the narrow strip portion 11$a$2 is formed on the bias magnet film 11$b$3.

The narrow strip portion 11$a$3 is disposed adjacent to the narrow strip portion 11$a$2 on the negative side thereof along the X-axis. One end portion of the narrow strip portion 11$a$3 is formed on the bias magnet film 11$b$3 and is connected, on the bias magnet film 11$b$3, to the narrow strip portion 11$a$2. The other end portion of the narrow strip portion 11$a$3 is formed on the bias magnet film 11$b$4.

The narrow strip portion 11a4 is disposed adjacent to the narrow strip portion 11a3 on the negative side thereof along the X-axis. One end portion of the narrow strip portion 11a4 is formed on the bias magnet film 11b4 and is connected, on the bias magnet film 11b4, to the narrow strip portion 11a3. The other end portion of the narrow strip portion 11a4 is formed on the bias magnet film 11b5.

The narrow strip portion 11a5 is disposed adjacent to the narrow strip portion 11a4 on the negative side thereof along the X-axis. One end portion of the narrow strip portion 11a5 is formed on the bias magnet film 11b5 and is connected, on the bias magnet film 11b5, to the narrow strip portion 11a4. The other end portion of the narrow strip portion 11a5 is formed on the bias magnet film 11b6.

The narrow strip portion 11a6 is disposed adjacent to the narrow strip portion 11a5 on the negative side thereof along the X-axis. One end portion of the narrow strip portion 11a6 is formed on the bias magnet film 11b6 and is connected, on the bias magnet film 11b6, to the narrow strip portion 11a5. The other end portion of the narrow strip portion 11a6 is formed on the bias magnet film 11b7. The bias magnet film 11b7 is connected to the terminal portion 11c2.

Figure 5:
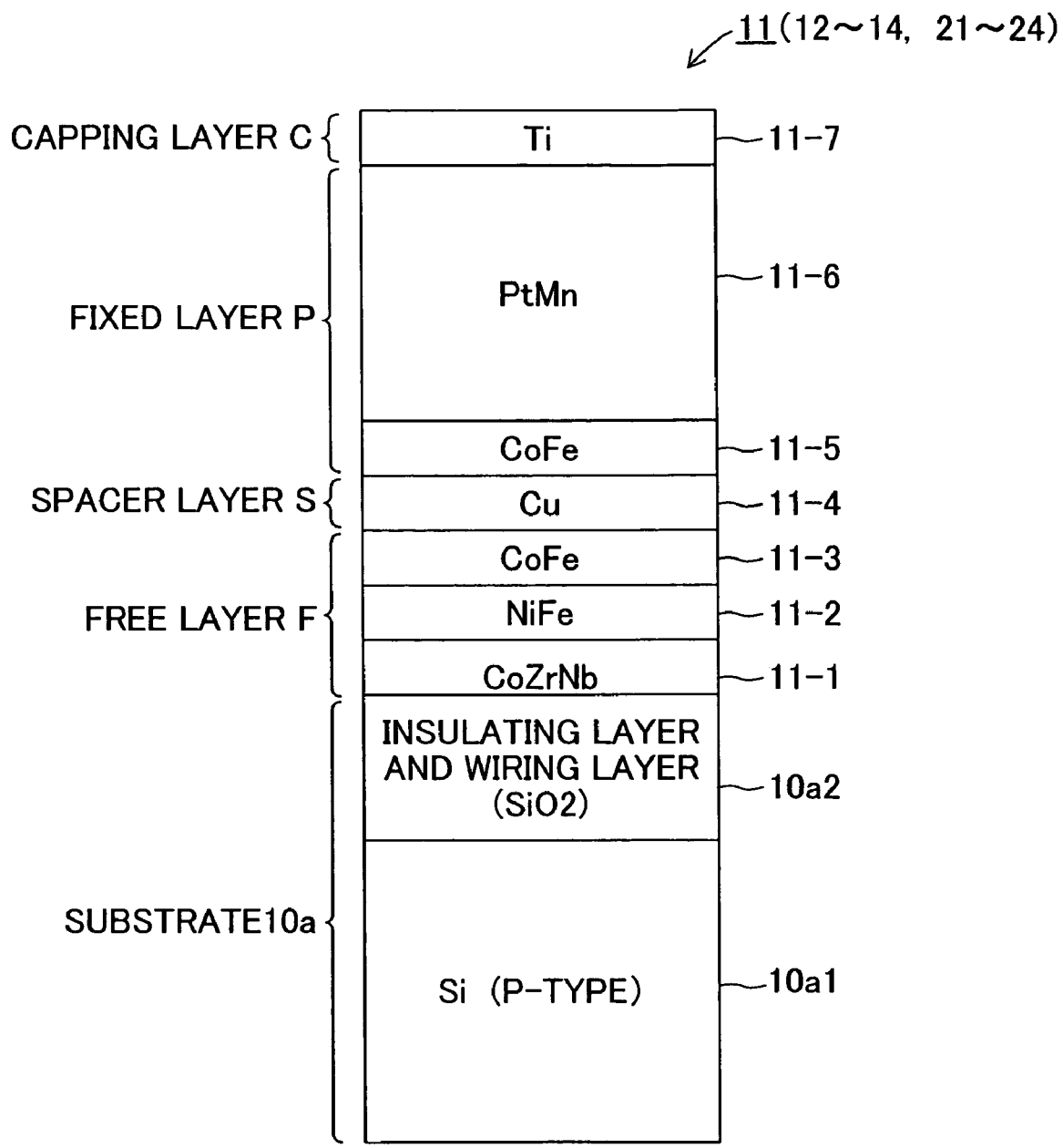
FIG. 5 is a view showing the film configuration of the first X-axis GMR element shown in FIG. 3.

The narrow strip portions 11a1 to 11a6 are each formed of a spin valve film whose configuration is shown in FIG. 5. The spin valve film includes a free layer F formed on the substrate 10a; a spacer layer S formed on the free layer F; a fixed layer P formed on the spacer layer S; and a capping layer C formed on the fixed layer P. The substrate 10a includes a P-type Si layer 10a1 and an $SiO_2$ (or SiN) dielectric layer (an insulating layer and a wiring layer) 10a2, which is superposed on the P-type Si layer 10a1.

The magnetization direction of the free layer F varies in accordance with the direction of an external magnetic field. The free layer F includes a CoZrNb amorphous magnetic layer 11-1 formed on the substrate 10a and having a thickness of 8 nm (80 angstroms); an NiFe magnetic layer 11-2 formed on the CoZrNb amorphous magnetic layer 11-1 and having a thickness of 3.3 nm (33 angstroms); and a CoFe layer 11-3 formed on the NiFe magnetic layer 11-2 and having a thickness of about 1 nm to 3 nm (10 angstroms to 30 angstroms). The CoZrNb amorphous magnetic layer 11-1 and the NiFe magnetic layer 11-2 constitute a soft ferromagnetic film.

The spacer layer S is an electrically conductive film made of Cu and having a thickness of 2.4 nm (24 angstroms). Notably, the CoFe layer 11-3 prevents diffusion of Ni from the NiFe layer 11-2 and diffusion of Cu from a Cu layer 11-4 of the spacer layer S.

The fixed layer (pinned layer or magnetization-fixed layer) P is a laminate of CoFe magnetic layer 11-5 having a thickness of 2.2 nm (22 angstroms) and an antiferromagnetic film 11-6 having a thickness of 24 nm (240 angstroms) and made of a PtMn alloy that contains Pt in an amount of 45 mol % to 55 mol %. The CoFe magnetic layer 11-5 is backed in an exchange-coupled manner by the antiferromagnetic film 11-6 that is a pinning layer, to thereby become a pinned layer whose magnetization (magnetization vector) is pinned in the negative direction of the X-axis. The magnetization direction of the CoFe 11-5 is a direction in which the magnetization of the pinned layer of the first X-axis GMR element 11 is pinned.

The capping layer C has a thickness of 1.5 nm (15 angstroms) and is made of titanium (Ti) or tantalum (Ta).

Referring back to FIG. 3, the bias magnet films 11b1 to 11b7 are made of a hard ferromagnetic material, such as CoCrPt, having high coercive force and high remanence ratio and are magnetized to become permanent magnet films. The bias magnet films 11b1 to 11b7 apply a bias magnetic field to the free layer F in a longitudinal direction of the free layer F in order to maintain uniaxial anisotropy of the free layer F. In the first X-axis GMR element 11, the bias magnet films 11b1 to 11b7 apply a bias magnetic field in the negative direction of the Y-axis.

Figure 6:
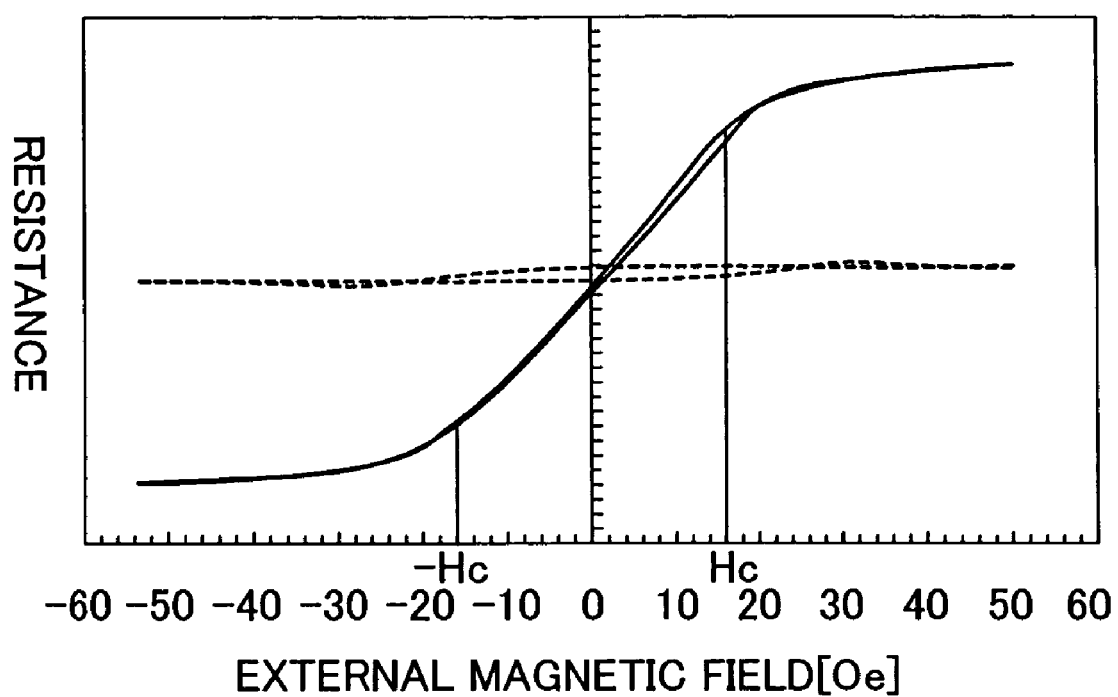
FIG. 6 is a graph showing a variation in resistance of the first X-axis GMR element shown in FIG. 3.

With the above configuration, the resistance of the first X-axis GMR element 11 is obtained from the terminal portions 11c1 and 11c2 as the sum of individual resistances of the narrow strip portions 11a1 to 11a6. As a result, as shown in FIG. 6, in the presence of an external magnetic field that varies along the X-axis, the characteristic value; i.e., resistance (which increases with the intensity of the external magnetic field along a certain direction; i.e., the positive direction of the X-axis), of the first X-axis GMR element 11 varies substantially in proportion to the external magnetic field within the range of −Hc to +Hc. The resistance of the first X-axis GMR 11 is substantially constant in the presence of an external magnetic field that varies along the Y-axis. In other words, the first X-axis GMR element 11 detects a magnetic field in the direction in which the magnetization of the pinned layer is pinned (in parallel or antiparallel; in the present embodiment, antiparallel, with the direction in which the magnetization of the pinned layer is pinned).

Again, referring to FIG. 1, the first X-axis GMR element 11 is formed on the substrate 10a at a position located on a side toward the positive direction of the Y-axis with respect to a central portion of the substrate 10a and in the vicinity of an edge portion of the substrate 10a with respect to the negative direction of the X-axis. As mentioned above, the magnetization of the pinned layer of the first X-axis GMR element 11 is pinned in the negative direction of the X-axis. The second X-axis GMR element 12 is formed on the substrate 10a at a position located on a side toward the negative direction of the Y-axis with respect to the central portion of the substrate 10a and in the vicinity of an edge portion of the substrate 10a with respect to the negative direction of the X-axis. The magnetization of the pinned layer of the second X-axis GMR element 12 is pinned in the negative direction of the X-axis. Accordingly, the first X-axis GMR element 11 and the second X-axis GMR element 12 detect a magnetic field in the positive direction of the X-axis.

The third X-axis GMR element 13 is formed on the substrate 10a at a position located on a side toward the positive direction of the Y-axis with respect to a central portion of the substrate 10a and in the vicinity of an edge portion of the substrate 10a with respect to the positive direction of the X-axis. The magnetization of the pinned layer of the third X-axis GMR element 13 is pinned in the positive direction of the X-axis. The fourth X-axis GMR element 14 is formed on the substrate 10a at a position located on a side toward the negative direction of the Y-axis with respect to the central portion of the substrate 10a and in the vicinity of an edge portion of the substrate 10a with respect to the positive direction of the X-axis. The magnetization of the pinned layer of the fourth X-axis GMR element 14 is pinned in the positive direction of the X-axis. Accordingly, the third X-axis GMR element 13 and the fourth X-axis GMR element 14 detect a magnetic field in the negative direction of the X-axis.

The first Y-axis GMR element 21 is formed on the substrate 10a at a position located on a side toward the negative direction of the X-axis with respect to a central portion of the substrate 10a and in the vicinity of an edge portion of the substrate 10a with respect to the positive direction of the Y-axis. The magnetization of the pinned layer of the first Y-axis GMR element 21 is pinned in the positive direction of the Y-axis. The second Y-axis GMR element 22 is formed on the substrate 10a at a position located on a side toward the positive direction of the X-axis with respect to the central portion of the substrate 10a and in the vicinity of an edge portion of the substrate 10a with respect to the positive direction of the Y-axis. The magnetization of the pinned layer of the second Y-axis GMR element 22 is pinned in the positive direction of the Y-axis. Accordingly, the first Y-axis GMR element 21 and the second Y-axis GMR element 22 detect a magnetic field in the negative direction of the Y-axis.

The third Y-axis GMR element 23 is formed on the substrate 10a at a position located on a side toward the negative direction of the X-axis with respect to a central portion of the substrate 10a and in the vicinity of an edge portion of the substrate 10a with respect to the negative direction of the Y-axis. The magnetization of the pinned layer of the third Y-axis GMR element 23 is pinned in the negative direction of the Y-axis. The fourth Y-axis GMR element 24 is formed on the substrate 10a at a position located on a side toward the positive direction of the X-axis with respect to the central portion of the substrate 10a and in the vicinity of an edge portion of the substrate 10a with respect to the negative direction of the Y-axis. The magnetization of the pinned layer of the fourth Y-axis GMR element 24 is pinned in the negative direction of the Y-axis. Accordingly, the third Y-axis GMR element 23 and the fourth Y-axis GMR element 24 detect a magnetic field in the positive direction of the Y-axis.

As described above, the GMR elements 11 to 14 and 21 to 24 are fixed on the substrate 10a in the vicinity of corresponding central portions of sides of an imaginary regular polygon; in the present embodiment, an imaginary square (a square VS similar to the shape of the substrate 10a and represented by the imaginary line in FIG. 1) such that a direction in which the GMR elements 11 to 14 and 21 to 24 each detect a magnetic field which perpendicularly intersects a corresponding side of the square VS.

In other words, a magnetic field detecting direction of each of the first X-axis GMR element 11 and the second X-axis GMR element 12 is the negative direction of the X-axis, and a magnetic field detecting direction of each of the third X-axis GMR element 13 and the fourth X-axis GMR element 14 is the positive direction of the X-axis. Similarly, a magnetic field detecting direction of each of the first Y-axis GMR element 21 and the second Y-axis GMR element 22 is the negative direction of the Y-axis, and a magnetic field detecting direction of each of the third Y-axis GMR element 23 and the fourth Y-axis GMR element 24 is the positive direction of the Y-axis.

As shown in FIGS. 1 and 2, the movable coil section 30 includes a weight section 31, a movable coil 32, first to eighth support members 33a to 33h, and coil connection pads 34a and 34b.

The weight section 31 is formed of $SiO_2$. The weight section 31 is a thin plate that, as viewed in plane, assumes a square shape (i.e., a polygonal shape similar to an imaginary polygon) smaller than the substrate 10a and the imaginary square VS and that has a small thickness along the direction of the Z-axis. The movable coil 32 is formed of polysilicon (or tungsten). The movable coil 32 is formed on the upper surface of the weight section 31. As viewed in plane, the movable coil 32 assumes a square shape whose sides extend along the corresponding sides of the weight section 31. The sides of the movable coil 32 are formed in the vicinity of the corresponding sides of the weight section 31. In other words, the movable coil 32 assumes a square shape similar to and slightly smaller than the imaginary square VS.

One end of each of the first to eighth support members 33a to 33h is fixedly connected to a corresponding corner of the weight section 31, and the other end is fixedly connected to the upper surface of the substrate 10a. With this configuration, the first to eighth support members 33a to 33h support the weight section 31 on the substrate 10a such that the weight section 31 (accordingly, the movable coil 32) is movable in a plane in parallel with the main surface of the substrate 10a (in a plane in parallel with the X-Y plane).

Figure 7:
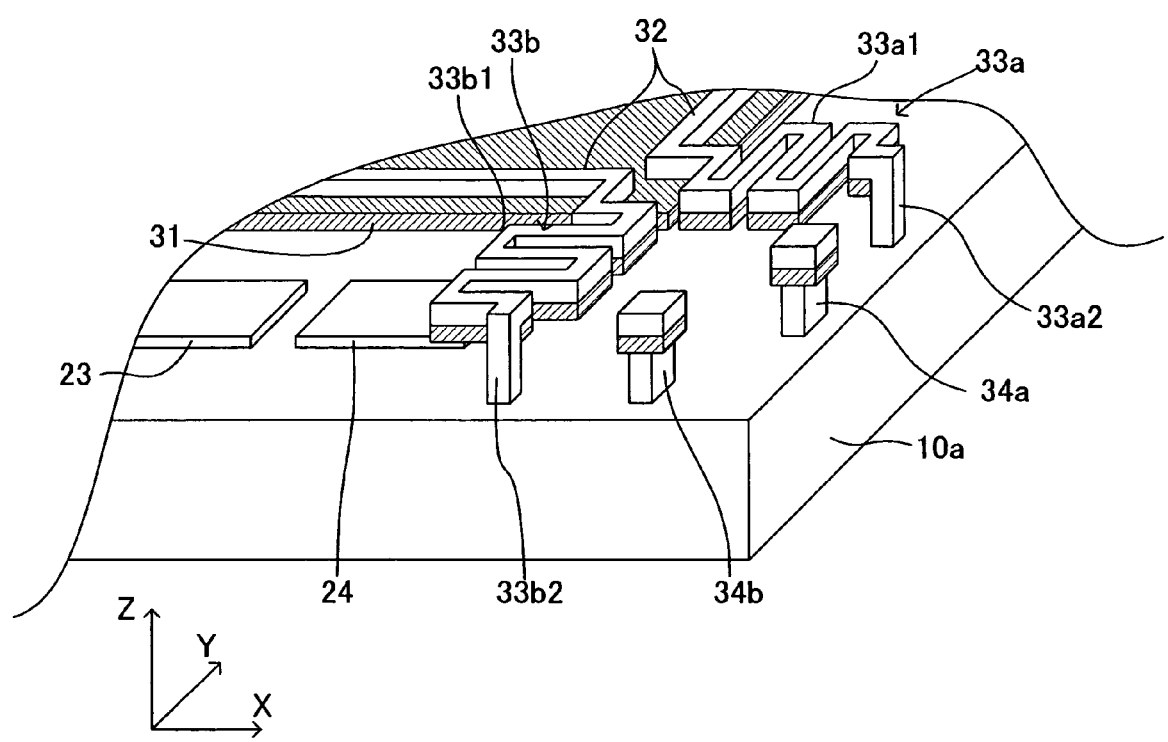
FIG. 7 is a partial, perspective view of the sensor shown in FIG. 1.

More specifically, as shown in FIG. 7, which is a partial perspective view of the sensor 10, the first support member 33a includes a spring portion 33a1 and a support portion 33a2. A lower portion of the spring portion 33a1 is formed of $SiO_2$. One end of the lower portion of the spring portion 33a1 is connected to a wall of the weight section 31 in parallel with the Y-Z plane, at an edge portion of the weight section 31 with respect to the positive direction of the X-axis and an edge portion of the weight section 31 with respect to the negative direction of the Y-axis. An upper portion of the spring portion 33a1 is formed of polysilicon, which is used to form the movable coil 32. One end of the upper portion of the spring portion 33a1 is connected to a side of the movable coil 32 extending along the Y-axis and located above the edge portion of the weight section 31 with respect to the positive direction of the X-axis, at an end portion of the side with respect to the negative direction of the Y-axis.

As viewed in plane, the spring portion 33a1 is formed in zigzag so as to exhibit spring qualities (elasticity). The spring portion 33a1 is disposed in parallel with the X-Y plane and extends in the positive direction of the X-axis. The other ends of the upper and lower portions of the spring portion 33a1 are connected to one end of the support portion 33a2. The support portion 33a2 is formed of polysilicon. The support portion 33a2 assumes a quadrangular prism shape. The other end of the support portion 33a2 is fixed on the substrate 10a, whereby the support portion 33a2 stands on the substrate 10a.

The second support member 33b includes a spring portion 33b1 and a support portion 33b2 and has a structure identical with that of the first support member 33a. One end of a lower portion of the spring portion 33b1 is connected to a wall of the weight section 31 in parallel with the X-Z plane, at an edge portion of the weight section 31 with respect to the positive direction of the X-axis and an edge portion of the weight section 31 with respect to the negative direction of the Y-axis. One end of an upper portion of the spring portion 33b1 is connected to a side of the movable coil 32 extending along the X-axis and located above the edge portion of the weight section 31 with respect to the negative direction of the Y-axis, at an end portion of the side with respect to the positive direction of the X-axis.

As in the case of the spring portion 33a1, as viewed in plane, the spring portion 33b1 is formed in zigzag so as to exhibit spring qualities. The spring portion 33b1 is disposed in parallel with the X-Y plane and extends in the negative direction of the Y-axis. The other ends of the upper and lower portions of the spring portion 33b1 are connected to one end of the support portion 33b2. The support portion 33b2 is formed of polysilicon. The support portion 33b2 assumes a quadrangular prism shape. The other end of the support portion 33b2 is fixed on the substrate 10a, whereby the support portion 33b2 stands on the substrate 10a. As described above, the first and the second support members 33a and 33b may be elastic, such as a spring-tempered support member.

The third support member 33c to the eighth support member 33h each have a structure similar to that of the first support member 33a. However, upper polysilicon portions of spring portions of the third to eighth support members 33c to 33h are not connected to the movable coil 32. As shown in FIG. 1, the third support member 33c to the eighth support member 33h are disposed at corresponding corner portions of the weight section 31.

With the above-described configuration, when the sensor 10 is in a stationary condition (when no acceleration arises in the sensor 10), the weight section 31 and the movable coil 32 are maintained at an initial position shown in FIG. 1. When the weight section 31 and the movable coil 32 are at the initial position, as viewed in plane, the barycenter Q of the weight section 31 and the movable coil 32 coincides with the barycenter (the barycenter of the imaginary square VS) G of the GMR elements 11 to 14 and 21 to 24, and the sides of the movable coil 32 are in parallel with the corresponding sides of the imaginary square VS. When the sensor 10 is subjected to acceleration that arises in the main surface of the substrate 10a, associated inertial force causes the weight section 31 and the movable coil 32 to translate from the initial position in a direction counter to the acceleration. When a force to rotate the sensor 10 is applied to the sensor 10 in the main surface of the substrate 10a, as viewed in plane, the weight section 31 and the movable coil 32 rotatively move around the barycenter G (Q).

As shown in FIGS. 1 and 7, the coil connection pads 34a and 34b are disposed at a corner portion of the substrate 10a associated with an edge portion of the substrate 10a with respect to the positive direction of the X-axis and an edge portion of the substrate 10a with respect to the negative direction of the Y-axis. The coil connection pads 34a and 34b stand on the substrate 10a. The upper surfaces of the coil connection pads 34a and 34b are flush with the upper surface of the movable coil 32. The coil connection pad 34a is electrically connected to the support portion 33a2 in the interior of the substrate 10a. The coil connection pad 34b is electrically connected to the support portion 33b2 in the interior of the substrate 10a. The coil connection pads 34a and 34b are connected to an unillustrated constant-current supply external of the sensor 10 via unillustrated connection wires. The sensor 10 may contain a built-in constant-current supply. In this case, the movable coil 32 is connected to the built-in constant-current supply via the support portions 33a2 and 33b2.

As shown in FIG. 1, the circuit section 40 is formed within the substrate 10a under the movable coil section 30. As will be described below, the circuit section 40 includes a changeover block for making a changeover with respect to a connection relation among the GMR elements 11 to 14 and with respect to a connection relation among the GMR elements 21 to 24 in accordance with a measuring item of the sensor 10; i.e., an external magnetic field (e.g., terrestrial magnetism), acceleration, or angular acceleration. Also, the circuit section 40 includes a constant-voltage supply for maintaining an electric potential VB. The circuit section 40 enables the sensor 10 to output (measure) a value corresponding to a measuring item to the exterior of the sensor 10. The circuit section 40 further includes electric-current control means for sending an instruction signal to the constant-current supply such that, when acceleration or angular acceleration is to be measured, a constant current I flows to the movable coil 32 so as to energize the movable coil 32 and such that, when an external magnetic field is to be measured, no current flows to the movable coil 32 (the movable coil 32 is de-energized).

Next will be described how the sensor 10 measures an external magnetic field, and acceleration or angular acceleration thereof.

Figure 8A:
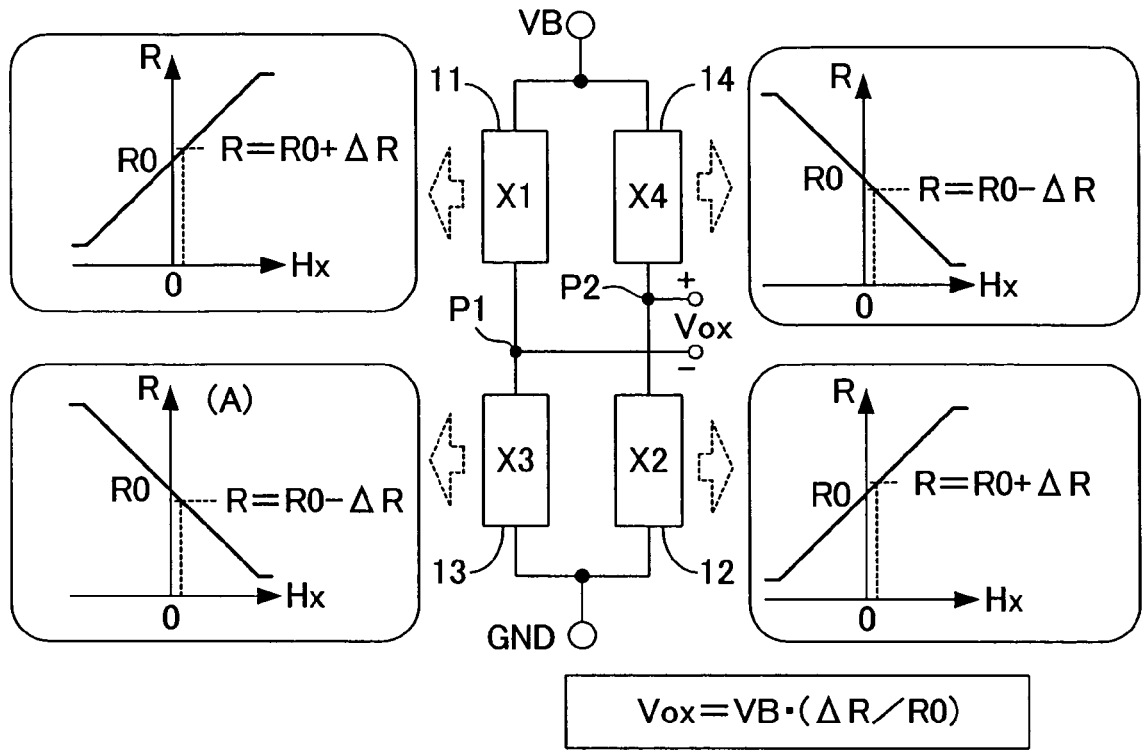
FIG. 8A is an equivalent circuit diagram of the sensor shown in FIG. 1, depicting the case where a component of an external magnetic field along the direction of the X-axis is measured.

Measurement of External Magnetic Field: Measuring Component of External Magnetic Field along the Direction of X-axis First will be described the case where the sensor 10 measures a component of an external magnetic field along the direction of the X-axis. In this case, the circuit section 40 of the sensor 10 connects the first X-axis GMR element 11 to the fourth X-axis GMR element 14 in a full bridge connection as shown in FIG. 8A. In FIG. 8A, graphs which accompany the first to fourth X-axis GMR elements 11 to 14, respectively, show variation in characteristic values of the GMR elements adjacent thereto (variation in resistance R of the individual GMR elements in association with variation of an external magnetic field Hx along the X-axis).

More specifically, one end of the first X-axis GMR element 11 and one end of the fourth X-axis GMR element 14 are connected to the constant-voltage supply that maintains the electric potential VB. One end of the second X-axis GMR element 12 and one end of the third X-axis GMR element 13 are grounded. The other end of the first X-axis GMR element 11 and the other end of the third X-axis GMR element 13 are electrically connected together at a connection point P1. The other end of the fourth X-axis GMR element 14 and the other end of the second X-axis GMR element 12 are electrically connected together at a connection point P2. The potential difference between the connection point P2 and the connection point P1 is obtained as an output $V_{0x}$ of the sensor 10. Accordingly, the output $V_{0x}$ corresponds to a characteristic value (resistance) exhibited by each of the first X-axis GMR element 11 to the fourth X-axis GMR element 14.

Figure 8B:
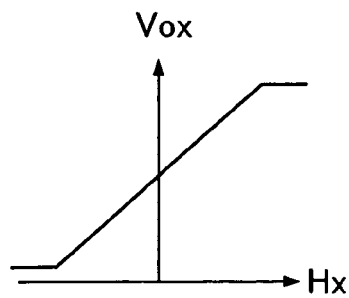
FIG. 8B is a graph showing the output characteristic of the sensor of FIG. 8A.

As mentioned previously, when an external magnetic field is to be measured, the circuit section 40 does not cause electric current to flow through the movable coil 32 (the circuit section 40 does not activate application of electric current to the movable coil 32). As a result, resistance (characteristic value) exhibited by each of the first X-axis GMR element 11 to the fourth X-axis GMR element 14 corresponds to the intensity of an external magnetic field. Accordingly, as shown in FIG. 8B, the sensor 10 outputs the voltage $V_{0x}$, which is substantially in proportion to the external magnetic field Hx that varies along the X-axis, and which increases as the external magnetic field Hx increases.

Measuring Acceleration of Sensor 10 along the Direction of X-axis:

Next will be described the case where the sensor 10 measures acceleration of the sensor 10 (acceleration of an object on which the sensor 10 is fixed) along the direction of the X-axis. As in the case of measurement of an external magnetic field shown in FIG. 8A, the circuit section 40 of the sensor 10 connects the first X-axis GMR element 11 to the fourth X-axis GMR element 14 in a full bridge connection and outputs the potential difference $V_{0x}$ between the connection points P2 and P1 (see FIG. 9C). Further, the circuit section 40 causes electric current I to flow through the movable coil 32 (i.e., section 40 activates application of the constant current I to the movable coil 32). As a result, a magnetic field is generated around the movable coil 32.

Figure 9A:
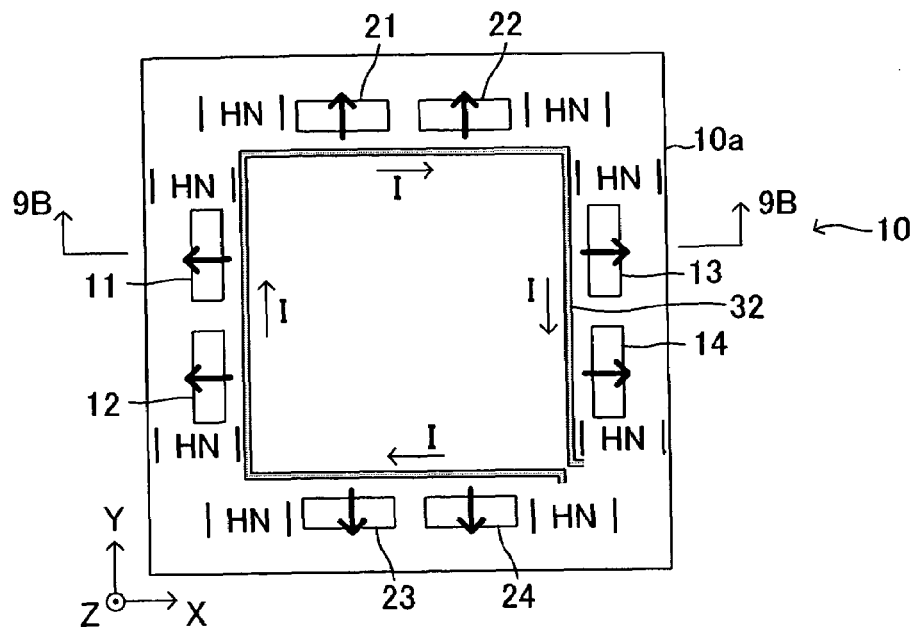
FIG. 9A is a schematic plan view of the sensor shown in FIG. 1, depicting the case where no acceleration is generated.
Figure 9B:
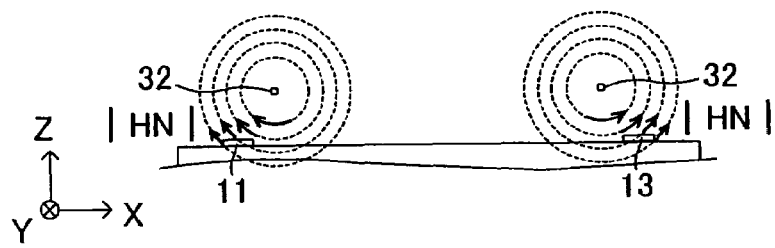
FIG. 9B is a schematic sectional view of the sensor cut by a plane extending along line 9B-9B of FIG. 9A.

Description will be continued on the assumption that no acceleration arises in the sensor 10. The movable coil 32 is positioned at the initial position shown in FIG. 9A. Accordingly, as shown in FIG. 9A and FIG. 9B, which is a sectional view of the sensor 10 (excluding the weight section 31) cut by a plane extending along line 9B-9B of FIG. 9A, a magnetic field directed in the negative direction of the X-axis and having a first intensity HN (HN>0) is applied to the first X-axis GMR element 11 and to the second X-axis GMR element 12. A magnetic field directed in the positive direction of the X-axis and having the first intensity HN is applied to the third X-axis GMR element 13 and the fourth X-axis GMR element 14. Notably, even when acceleration along a direction different from the direction of the X-axis arises in the sensor 10, the above-mentioned magnetic fields are applied to the corresponding first to fourth X-axis GMR elements 11 to 14. The magnetic fields that are applied to the corresponding first to fourth X-axis GMR elements 11 to 14 and the corresponding first to fourth Y-axis GMR elements 21 to 24 as a result of application of electric current to the movable coil 32 are sufficiently large in intensity in comparison with the terrestrial magnetic field (the same applies to the following description).

Figure 9C:
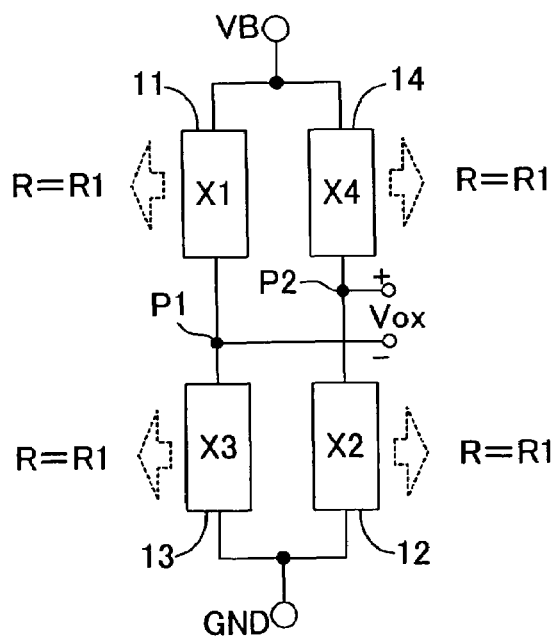
FIG. 9C is an equivalent circuit diagram of the sensor, depicting the case where acceleration is measured.
Figure 10A:
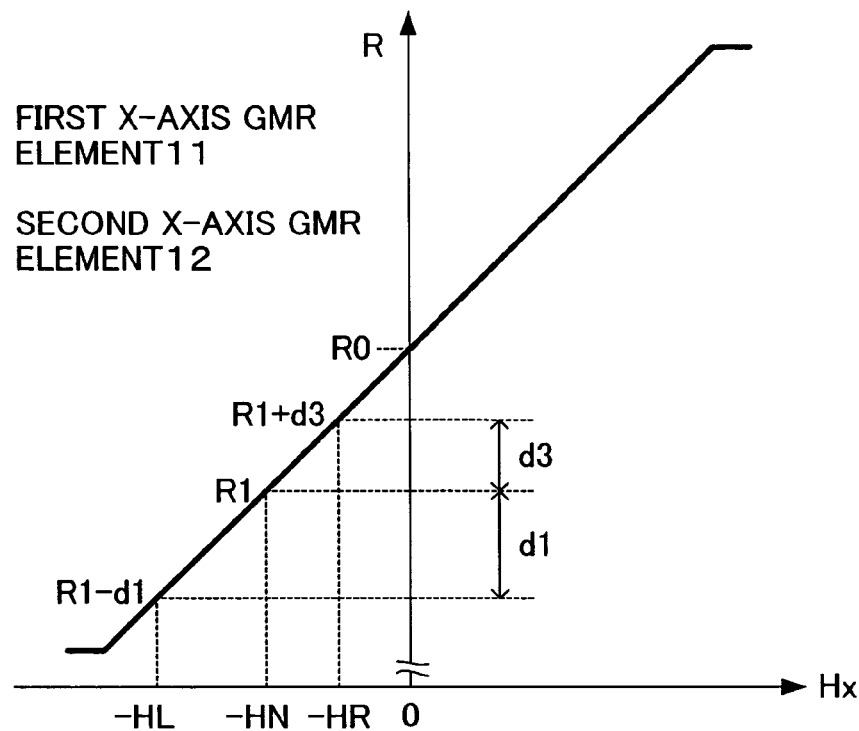
FIG. 10A is a graph showing a variation in resistance of the first and second X-axis GMR elements shown in FIG. 1.
Figure 10B:
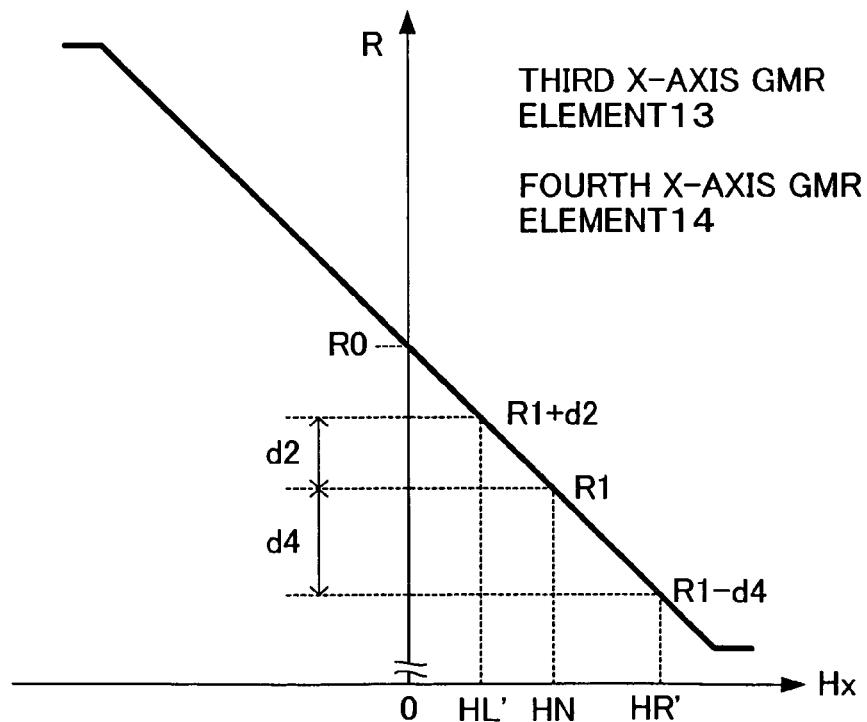
FIG. 10B is a graph showing a variation in resistance of the third and fourth X-axis GMR elements shown in FIG. 1.

At this time, as shown in FIG. 10A, the first X-axis GMR element 11 and the second X-axis GMR element 12 assume a resistance R1. The resistance R1 is lower than a reference resistance R0, which the first to fourth X-axis GMR elements 11 to 14 and the first to fourth Y-axis GMR elements 21 to 24 assume when an external magnetic field is "0." Similarly, as shown in FIG. 10B, the third X-axis GMR element 13 and the fourth X-axis GMR element 14 assume the resistance R1. As a result, when no acceleration arises in the sensor 10, the output $V_{0x}$ of the sensor 10 becomes "0" as shown in FIG. 9C.

Next, suppose that a force in the positive direction of the X-axis is applied to the sensor 10, causing acceleration in the positive direction of the X-axis to arise in the sensor 10. At this time, as shown in FIG. 11A, associated inertial force causes the movable coil 32 (and the weight section 31) to translate from the initial position by a displacement corresponding to the inertial force in the negative direction of the X-axis.

Figure 11A:
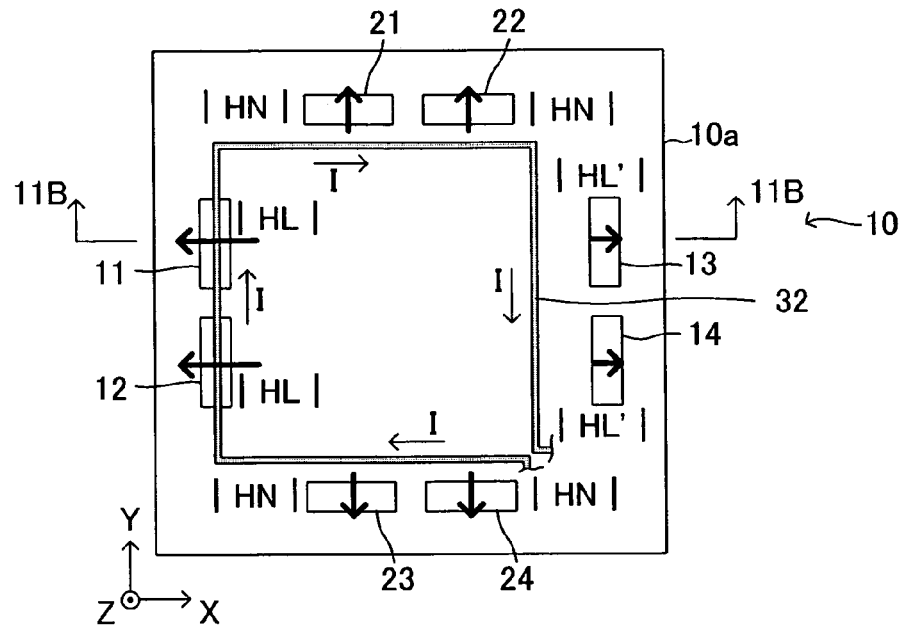
FIG. 11A is a schematic plan view of the sensor shown in FIG. 1, depicting the case where acceleration is generated.
Figure 11B:
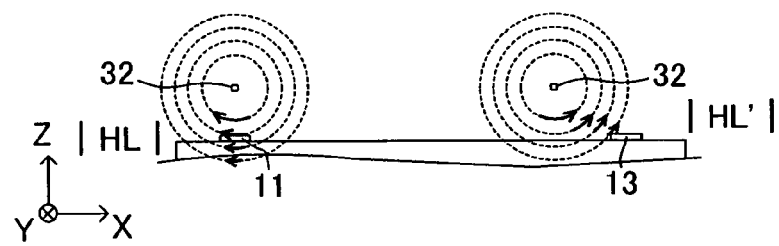
FIG. 11B is a schematic sectional view of the sensor cut by a plane extending along line 11B-11B of FIG. 11A.

Thus, as shown in FIG. 11A and FIG. 11B, which is a sectional view of the sensor 10 (excluding the weight section 31) cut by a plane extending along line 11B-11B of FIG. 11A, a magnetic field directed in the negative direction of the X-axis and having a second intensity HL greater than the first intensity HN (0<HN<HL) is applied to the first X-axis GMR element 11 and the second X-axis GMR element 12. A magnetic field directed in the positive direction of the X-axis and having a third intensity HL' less than the first intensity HN (0<HL'<HN) is applied to the third X-axis GMR element 13 and the fourth X-axis GMR element 14.

Figure 11C:
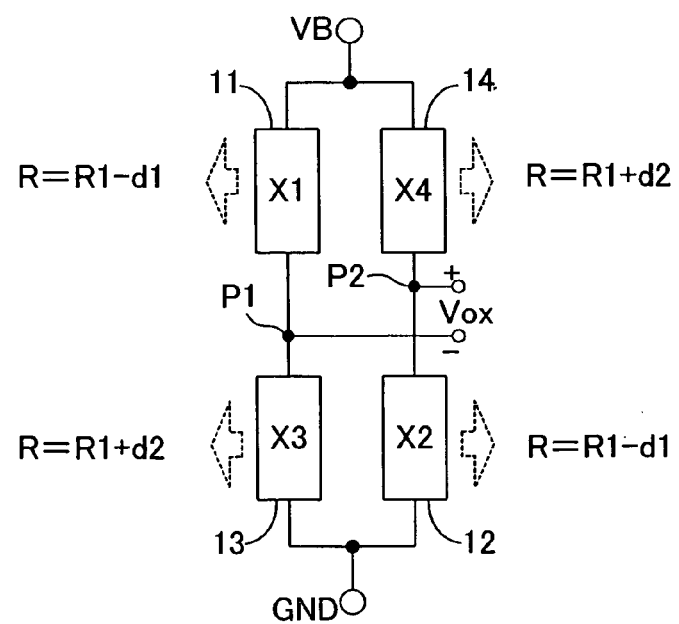
FIG. 11C is an equivalent circuit diagram of the sensor, depicting the case where acceleration is measured.

Accordingly, as shown in FIG. 10A, the first X-axis GMR element 11 and the second X-axis GMR element 12 assume a resistance R1−d1 (d1>0). As shown in FIG. 10B, the third X-axis GMR element 13 and the fourth X-axis GMR element 14 assume a resistance R1+d2(d2>0). As a result, when acceleration in the positive direction of the X-axis arises in the sensor 10, the output $V_{0x}$ of the sensor 10 becomes a value $V_{0x}1$ as shown in FIG. 11C and as expressed by the following Eq. (1).

$$V_{0x}=V_{0x}1=-VB\cdot(d1+d2)/(2R1+d2-d1) \qquad (1)$$

In this case, since d1 and d2 are sufficiently small in comparison with R1, Eq. (1) can be rewritten to the following Eq. (2).

$$V_{0x}=V_{0x}1=-VB\cdot(d1+d2)/2R1 \qquad (2)$$

As is apparent from Eq. (2), when acceleration in the positive direction of the X-axis arises in the sensor 10, the output value $V_{0x}$ of the sensor 10 becomes negative.

Next, suppose that a force in the negative direction of the X-axis is applied to the sensor 10, causing acceleration in the negative direction of the X-axis to arise in the sensor 10. At this time, as shown in FIG. 12A, associated inertial force causes the movable coil 32 to translate from the initial position by a displacement corresponding to the inertial force in the positive direction of the X-axis.

Figure 12A:
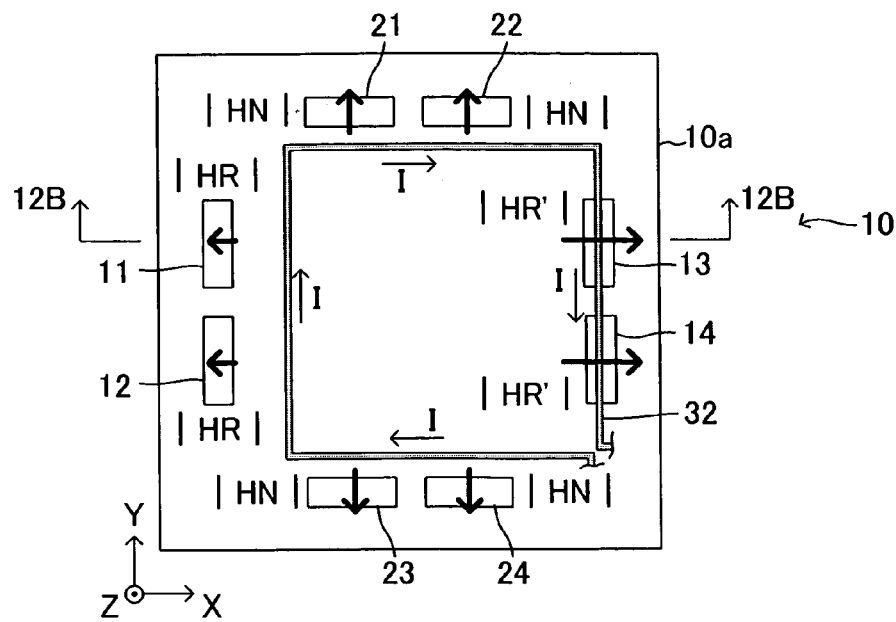
FIG. 12A is a schematic plan view of the sensor shown in FIG. 1, depicting the case where acceleration along the negative direction of the X-axis is generated.
Figure 12B:
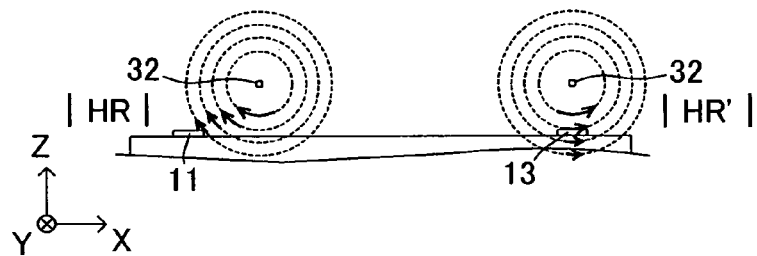
FIG. 12B is a schematic sectional view of the sensor cut by a plane extending along line 12B-12B of FIG. 12A.

Thus, as shown in FIG. 12A and FIG. 12B, which is a sectional view of the sensor 10 (excluding the weight section 31) cut by a plane extending along line 12B-12B of FIG. 12A, a magnetic field directed in the negative direction of the X-axis and having a fourth intensity HR less than the first intensity HN(0<HR<HN) is applied to the first X-axis GMR element 11 and the second X-axis GMR element 12. A magnetic field directed in the positive direction of the X-axis and having a fifth intensity HR' greater than the first intensity HN(0<HN<HR') is applied to the third X-axis GMR element 13 and the fourth X-axis GMR element 14.

Figure 12C:
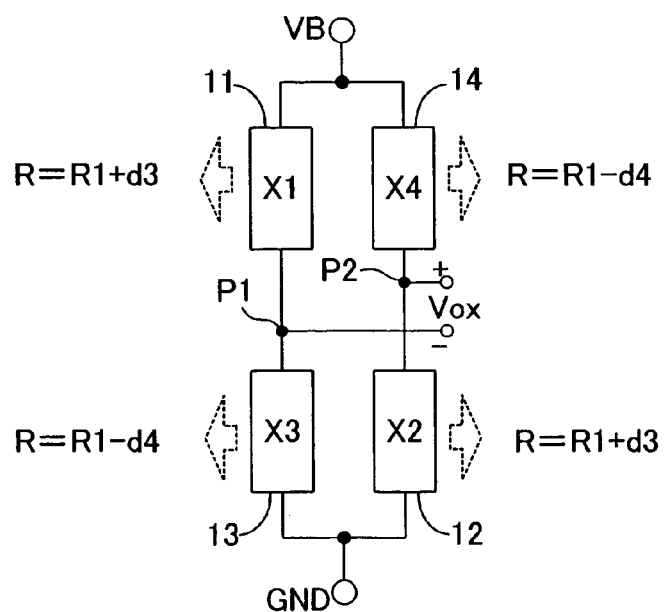
FIG. 12C is an equivalent circuit diagram of the sensor, depicting the case where acceleration is measured.

Accordingly, as shown in FIG. 10A, the first X-axis GMR element 11 and the second X-axis GMR element 12 assume a resistance R1+d3 (d3>0). As shown in FIG. 10B, the third X-axis GMR element 13 and the fourth X-axis GMR element 14 assume a resistance R1−d4 (d4>0). As a result, when acceleration in the negative direction of the X-axis arises in the sensor 10, the output $V_{0x}$ of the sensor 10 becomes a value $V_{0x}2$ as shown in FIG. 12C and as expressed by the following Eq. (3).

$$V_{0x}=V_{0x}2=VB\cdot(d3+d4)/(2R1+d3-d4) \qquad (3)$$

In this case, since d3 and d4 are sufficiently small in comparison with R1, Eq. (3) can be rewritten to the following Eq. (4).

$$V_{0x}=V_{0x}2=VB\cdot(d3+d4)/2R1 \qquad (4)$$

As is apparent from Eq. (4), when acceleration in the negative direction of the X-axis arises in the sensor 10, the output value $V_{0x}$ of the sensor 10 becomes positive.

The values d1 and d2 appearing in Eq. (2) increase as acceleration in the positive direction of the X-axis that arises in the sensor 10 increases. The values d3 and d4 appearing in Eq. (4) increase as acceleration in the negative direction of the X-axis that arises in the sensor 10 increases. Further, as mentioned previously, when no acceleration in the direction of the X-axis arises in the sensor 10, the output value $V_{0x}$ of the sensor 10 becomes "0." Thus, the output value $V_{0x}$ of the sensor 10 monotonically decreases in association with acceleration in the positive direction of the X-axis, so that acceleration in the direction of the X-axis can be measured on the basis of the output value $V_{0x}$.

Figure 13A:
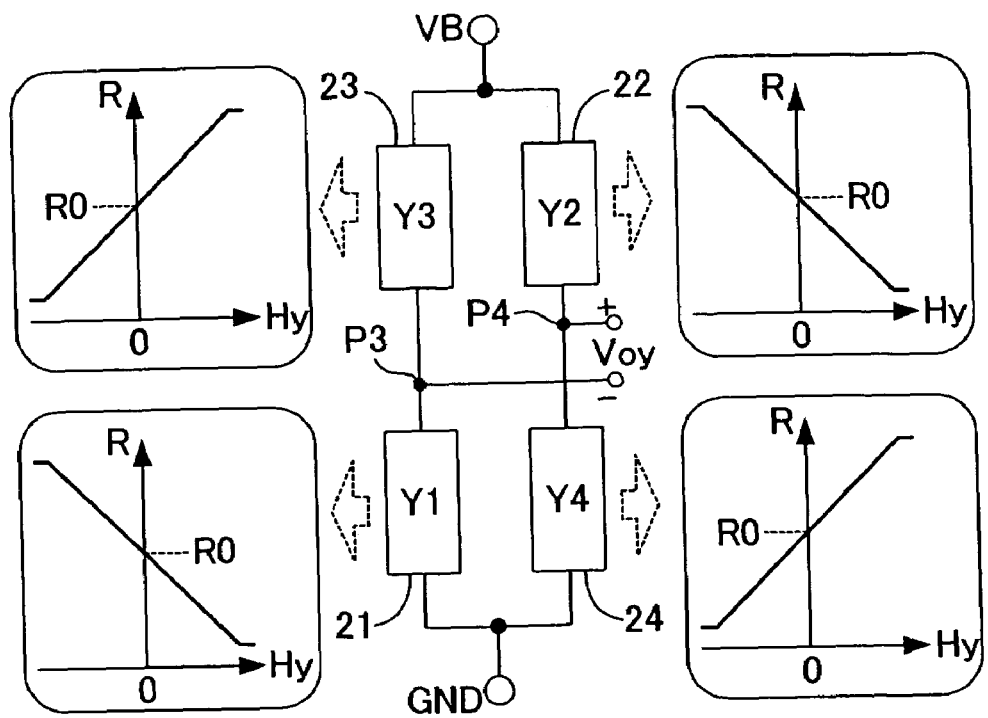
FIG. 13A is an equivalent circuit diagram of the sensor shown in FIG. 1, depicting the case where a component of an external magnetic field along the direction of the Y-axis is measured.

Measurement of External Magnetic Field: Measuring Component of External Magnetic Field along the Direction of Y-axis The sensor 10 measures a component of an external magnetic field and a component of acceleration along the direction of the Y-axis as in the case of measurement of those along the direction of the X-axis. Specifically, when a component of an external magnetic field along the direction of the Y-axis is to be measured, the circuit section 40 of the sensor 10 connects the first Y-axis GMR element 21 to the fourth Y-axis GMR element 24 in a full bridge connection as shown in FIG. 13A. In FIG. 13A, graphs which accompany the first to fourth Y-axis GMR elements 21 to 24, respectively, show variation in characteristic values of the GMR elements adjacent thereto (variation in resistance R of the individual GMR elements in association with variation of an external magnetic field Hy along the Y-axis).

One end of the second Y-axis GMR element 22 and one end of the third Y-axis GMR element 23 are connected to the constant-voltage supply that maintains the electric potential VB. One end of the first Y-axis GMR element 21 and one end of the fourth Y-axis GMR element 24 are grounded. The other end of the third Y-axis GMR element 23 and the other end of the first Y-axis GMR element 21 are electrically connected together at a connection point P3. The other end of the second Y-axis GMR element 22 and the other end of the fourth Y-axis GMR element 24 are electrically connected together at a connection point P4. The potential difference between the connection point P4 and the connection point P3 is obtained as an output $V_{Oy}$ of the sensor 10.

Figure 13B:
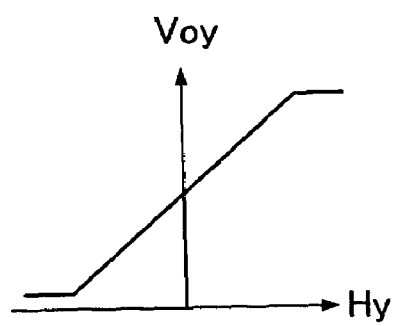
FIG. 13B is a graph showing the output characteristic of the sensor of FIG. 13A.

As mentioned previously, when an external magnetic field is to be measured, the circuit section 40 does not cause electric current to flow through the movable coil 32. As a result, resistance (characteristic value) exhibited by each of the first Y-axis GMR element 21 to the fourth Y-axis GMR element 24 corresponds to the intensity of an external magnetic field. Accordingly, as shown in FIG. 13B, the sensor 10 outputs the voltage $V_{Oy}$, which is substantially in proportion to the external magnetic field Hy that varies along the Y-axis, and which increases as the external magnetic field Hy increases.

Measuring Acceleration of Sensor 10 along the Direction of Y-axis:

Next will be described the case where the sensor 10 measures acceleration of the sensor 10 along the direction of the Y-axis. As in the case of measurement of an external magnetic field shown in FIG. 13A, the circuit section 40 of the sensor 10 connects the first Y-axis GMR element 21 to the fourth Y-axis GMR element 24 in a full bridge connection and outputs the potential difference $V_{Oy}$ between the connection points P4 and P3. Further, the circuit section 40 cause the constant current I to flow through the movable coil 32. As a result, a magnetic field is generated around the movable coil 32.

Description will be continued on the assumption that no acceleration arises in the sensor 10. The movable coil 32 is positioned at the initial position shown in FIG. 9A. Accordingly, as shown in FIG. 9A, a magnetic field directed in the positive direction of the Y-axis and having the first intensity HN is applied to the first Y-axis GMR element 21 and the second Y-axis GMR element 22. A magnetic field directed in the negative direction of the Y-axis and having the first intensity HN is applied to the third Y-axis GMR element 23 and the fourth Y-axis GMR element 24. Notably, even when acceleration along a direction different from the direction of the Y-axis arises in the sensor 10, the above-mentioned magnetic fields are applied to the corresponding first to fourth Y-axis GMR elements 21 to 24.

Figure 14A:
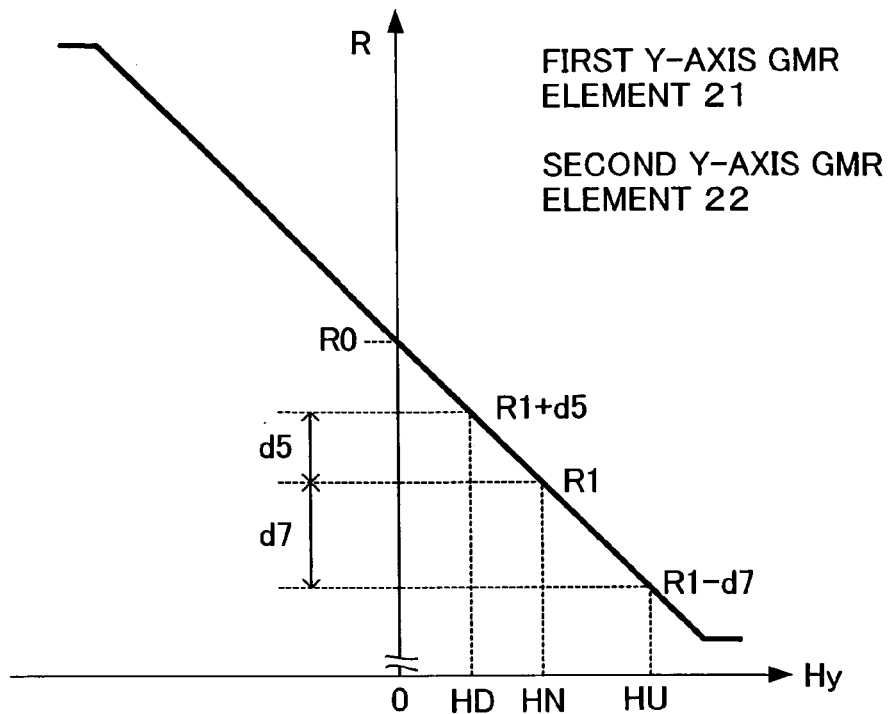
FIG. 14A is a graph showing a variation in resistance of the first and second Y-axis GMR elements shown in FIG. 1.
Figure 14B:
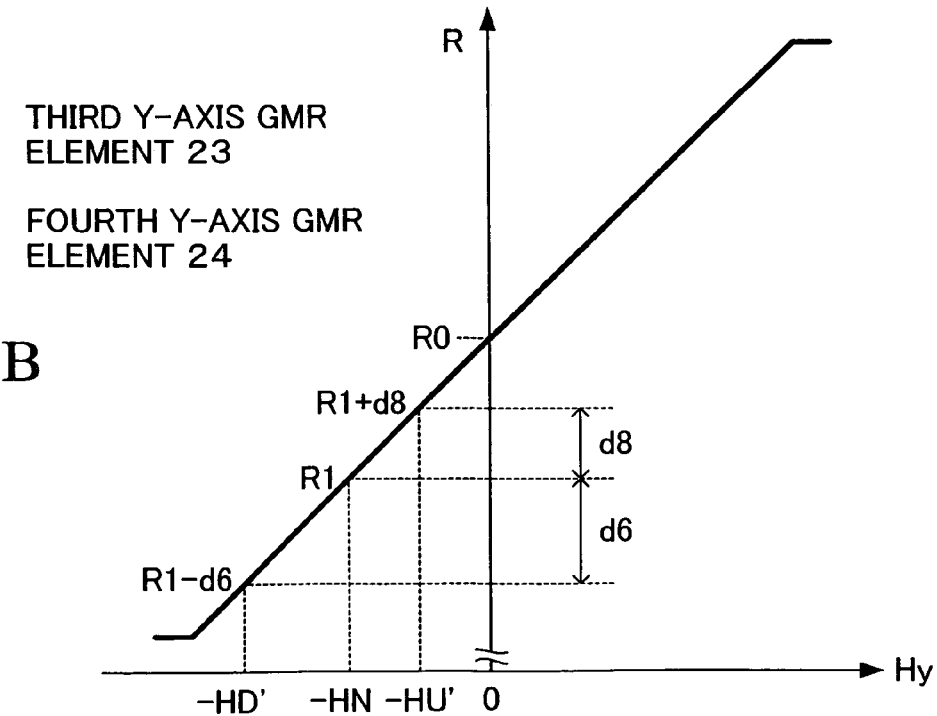
FIG. 14B is a graph showing a variation in resistance of the third and fourth Y-axis GMR elements shown in FIG. 1.

At this time, as shown in FIGS. 14A and 14B, all of the first Y-axis GMR element 21 to the fourth Y-axis GMR element 24 assume the resistance R1. As a result, when no acceleration in the direction of the Y-axis arises in the sensor 10, the output $V_{Oy}$ of the sensor 10 becomes "0."

Figure 15A:
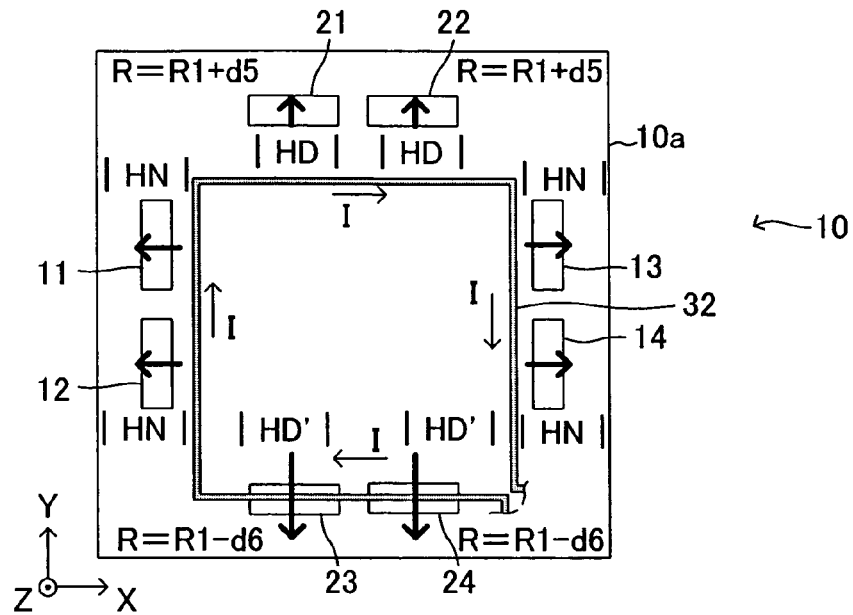
FIG. 15A is a schematic plan view of the sensor shown in FIG. 1, depicting the case where acceleration along the positive direction of the Y-axis is generated.

Next, suppose that a force in the positive direction of the Y-axis is applied to the sensor 10, causing acceleration in the positive direction of the Y-axis to arise in the sensor 10. At this time, as shown in FIG. 15A, associated inertial force causes the movable coil 32 (and the weight section 31) to translate from the initial position by a displacement corresponding to the inertial force in the negative direction of the Y-axis.

Thus, a magnetic field directed in the positive direction of the Y-axis and having a sixth intensity HD less than the first intensity HN(0<HD<HN) is applied to the first Y-axis GMR element 21 and the second Y-axis GMR element 22. A magnetic field directed in the negative direction of the Y-axis and having a seventh intensity HD' greater than the first intensity HN (0<HN<HD') is applied to the third Y-axis GMR element 23 and the fourth Y-axis GMR element 24.

Accordingly, as shown in FIG. 14A, the first Y-axis GMR element 21 and the second Y-axis GMR element 22 assume a resistance R1+d5 (d5>0). As shown in FIG. 14B, the third Y-axis GMR element 23 and the fourth Y-axis GMR element 24 assume a resistance R1−d6 (d6>0). As a result, when acceleration in the positive direction of the Y-axis arises in the sensor 10, the output $V_{Oy}$ of the sensor 10 becomes a value $V_{Oy}1$ as expressed by the following Eq. (5). Notably, Eq. (5) considers that d5 and d6 are sufficiently small in comparison with R1.

$$V_{Oy}=V_{Oy}1=-VB\cdot(d5+d6)/2R1 \qquad (5)$$

Figure 15B:
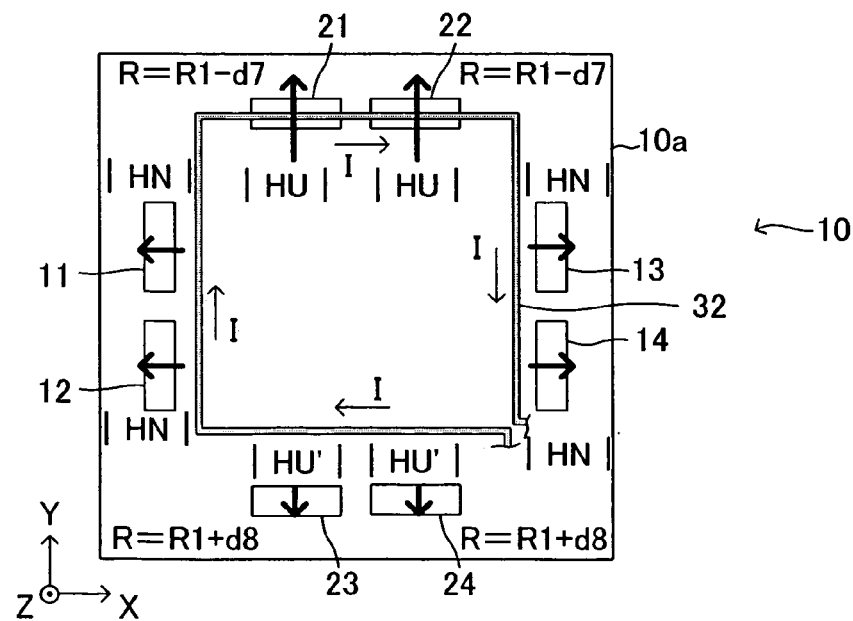
FIG. 15B is a schematic plan view of the sensor shown in FIG. 1, depicting the case where acceleration along the negative direction of the Y-axis is generated.

Next, suppose that a force in the negative direction of the Y-axis is applied to the sensor 10, causing acceleration in the negative direction of the Y-axis to arise in the sensor 10. At this time, as shown in FIG. 15B, associated inertial force causes the weight section 31 and the movable coil 32 to translate from the initial position by a displacement corresponding to the inertial force in the positive direction of the Y-axis.

Thus, a magnetic field directed in the positive direction of the Y-axis and having an eighth intensity HU greater than the first intensity HN(0<HN<HU) is applied to the first Y-axis GMR element 21 and the second Y-axis GMR element 22. A magnetic field directed in the negative direction of the Y-axis and having a ninth intensity HU' less than the first intensity HN(0<HU'<HN) is applied to the third Y-axis GMR element 23 and the fourth Y-axis GMR element 24.

Accordingly, as shown in FIG. 15A, the first Y-axis GMR element 21 and the second Y-axis GMR element 22 assume a resistance R1−d7 (d7>0). As shown in FIG. 15B, the third Y-axis GMR element 23 and the fourth Y-axis GMR element 24 assume a resistance R1+d8 (d8>0). As a result, when acceleration in the negative direction of the Y-axis arises in the sensor 10, the output $V_{Oy}$ of the sensor 10 becomes a value $V_{Oy}2$ as expressed by the following Eq. (6). Notably, Eq. (6) considers that d7 and d8 are sufficiently small in comparison with R1.

$$V_{Oy}=V_{Oy}2=VB\cdot(d7+d8)/2R1 \qquad (6)$$

The values d5 and d6 appearing in Eq. (5) increase as acceleration in the positive direction of the Y-axis that arises in the sensor 10 increases. The values d7 and d8 appearing in Eq. (6) increase as acceleration in the negative direction of the Y-axis that arises in the sensor 10 increases. Further, as mentioned previously, when no acceleration in the direction of the Y-axis arises in the sensor 10, the output value $V_{Oy}$ of the sensor 10 becomes "0." Thus, the output value $V_{Oy}$ of the sensor 10 monotonically decreases in association with acceleration in the positive direction of the Y-axis, so that acceleration in the direction of the Y-axis can be measured on the basis of the output value $V_{Oy}$.

Figure 16A:
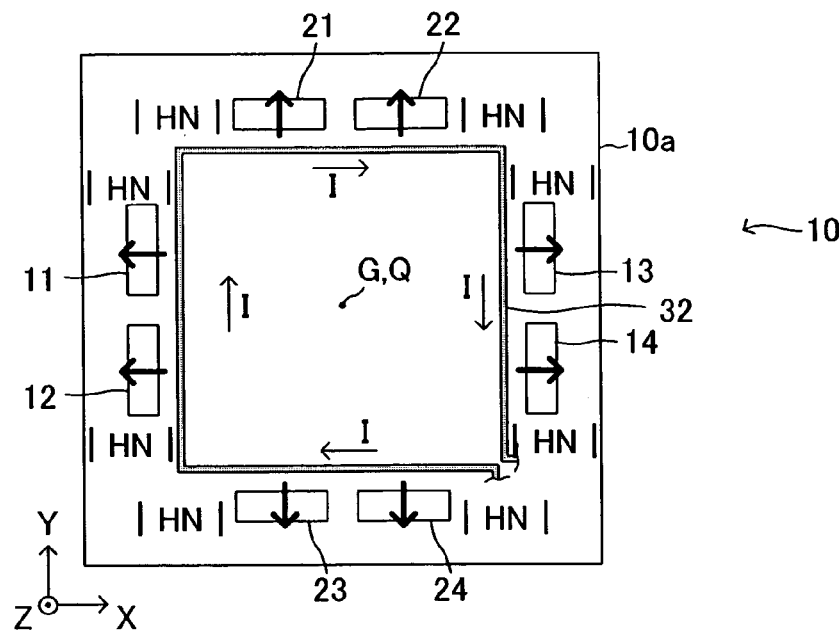
FIG. 16A is a schematic plan view of the sensor shown in FIG. 1, depicting the case where no angular acceleration is generated.
Figure 16B:
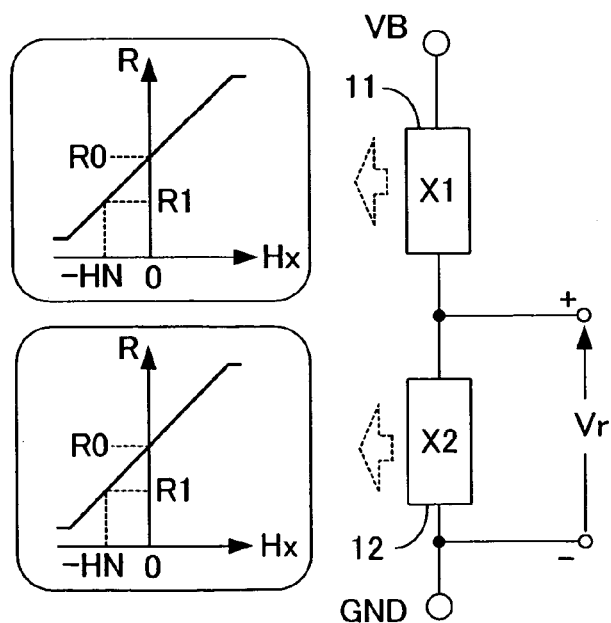
FIG. 16B is an equivalent circuit diagram of the sensor, depicting the case where angular acceleration is measured.

Measuring Angular Acceleration of Sensor 10:

Next will be described the case where the sensor 10 measures angular acceleration. In this case, as shown in FIG. 16B, the circuit section 40 of the sensor 10 connects the first X-axis GMR element 11 and the second X-axis GMR element 12 in a half bridge connection. Specifically, one end of the first X-axis GMR element 11 is connected to the constant-voltage supply that maintains the electric potential VB. The other end of the first X-axis GMR element 11 is connected to one end of the second X-axis GMR element 12. The other end of the second X-axis GMR element 12 is grounded. The circuit section 40 outputs a potential difference Vr between the opposite ends of the second X-axis GMR element 12. Further, the circuit section 40 causes the constant current I to flow through the movable coil 32.

Description will be continued on the assumption that no acceleration or angular acceleration arises in the sensor 10. The movable coil 32 is positioned at the initial position shown in FIG. 16A. Accordingly, a magnetic field directed in the negative direction of the X-axis and having the first intensity HN(HN>0) is applied to the first X-axis GMR element 11 and the second X-axis GMR element 12. As a result, the first X-axis GMR element 11 and the second X-axis GMR element 12 assume the resistance R1. Accordingly, as shown in FIG. 16B, the output value Vr of the sensor 10 becomes VB/2.

Figure 17A:
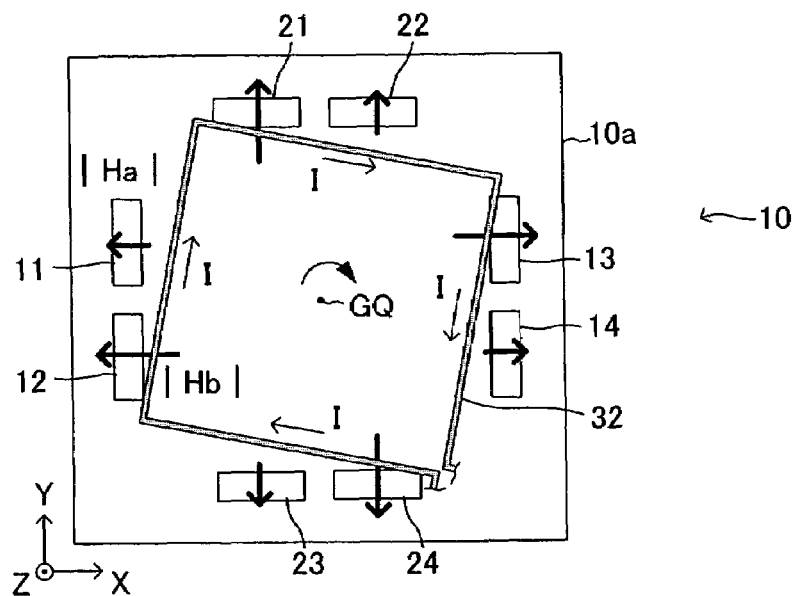
FIG. 17A is a schematic plan view of the sensor shown in FIG. 1, depicting the case where counterclockwise angular acceleration is generated.

Next, suppose that counterclockwise angular acceleration arises about the barycenter G (Q) in the X-Y plane of the sensor 10. At this time, as shown in FIG. 17A, associated inertial force causes the movable coil 32 (and the weight section 31) to rotate clockwise in the X-Y plane about the barycenter G from the initial position by an angle corresponding to the angular acceleration.

Figure 17B:
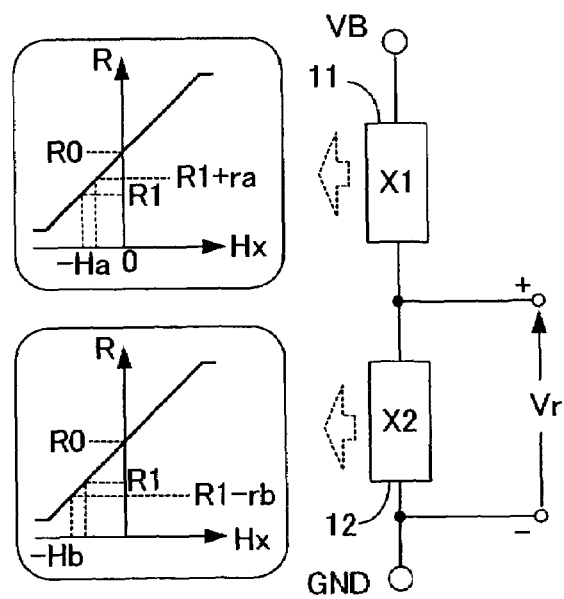
FIG. 17B is an equivalent circuit diagram of the sensor, depicting the case where angular acceleration is measured.

Thus, a magnetic field directed in the negative direction of the X-axis and having a tenth intensity Ha less than the first intensity HN(0<Ha<HN) is applied to the first X-axis GMR element 11. A magnetic field directed in the negative direction of the X-axis and having an eleventh intensity Hb greater than the first intensity HN(0<HN<Hb) is applied to the second X-axis GMR element 12. As a result, as shown in FIG. 17B, the first X-axis GMR element 11 assumes a resistance R1+ra (ra>0), and the second X-axis GMR element 12 assumes a resistance R1−rb (rb>0). Accordingly, the output value Vr of the sensor 10 becomes a value as expressed by the following Eq. (7).

$$Vr=VB \cdot (R1-rb)/(2R1+ra-rb) \quad (7)$$

In this case, since ra and rb are sufficiently small in comparison with R1, Eq. (7) can be rewritten to the following Eq. (8).

$$Vr=VB \cdot (R1-rb)/(2R1) \quad (8)$$

Figure 18A:
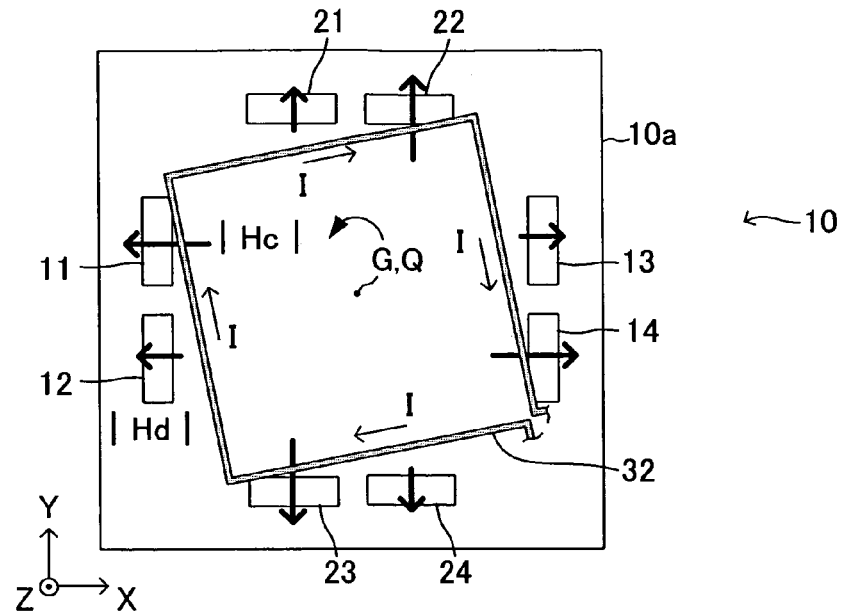
FIG. 18A is a schematic plan view of the sensor shown in FIG. 1, depicting the case where clockwise angular acceleration is generated.

Next, suppose that clockwise angular acceleration arises about the barycenter G (Q) in the X-Y plane of the sensor 10. At this time, as shown in FIG. 18A, associated inertial force causes the movable coil 32 to rotate counterclockwise in the X-Y plane about the barycenter G from the initial position by an angle corresponding to the angular acceleration.

Figure 18B:
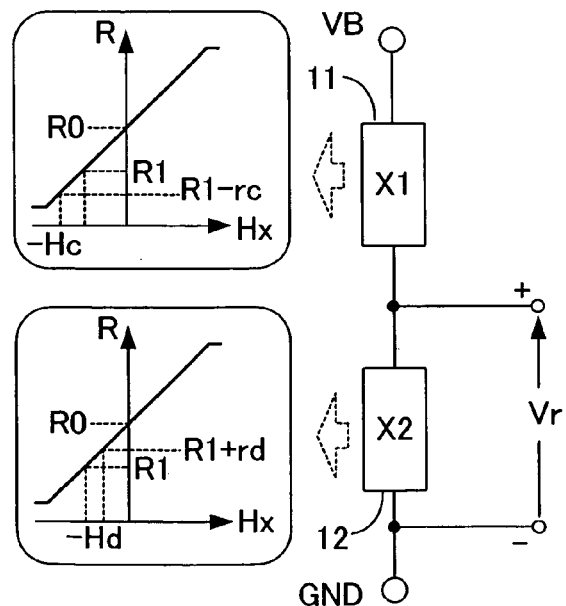
FIG. 18B is an equivalent circuit diagram of the sensor, depicting the case where angular acceleration is measured.

Thus, a magnetic field directed in the negative direction of the X-axis and having a twelfth intensity Hc greater than the first intensity HN(0<HN<Hc) is applied to the first X-axis GMR element 11. A magnetic field directed in the negative direction of the X-axis and having a thirteenth intensity Hd less than the first intensity HN(0<Hd<HN) is applied to the second X-axis GMR element 12. As a result, as shown in FIG. 18B, the first X-axis GMR element 11 assumes a resistance R1−rc (rc>0), and the second X-axis GMR element 12 assumes a resistance R1+rd (rd>0). Accordingly, the output value Vr of the sensor 10 becomes a value as expressed by the following Eq. (9).

$$Vr=VB \cdot (R1-rd)/(2R1+rd-rc) \quad (9)$$

In this case, since rc and rd are sufficiently small in comparison with R1, Eq. (9) can be rewritten to the following Eq. (10).

$$Vr=VB \cdot (R1-rd)/(2R1) \quad (10)$$

The value rb appearing in Eq. (8) increases as counterclockwise angular acceleration increases. The value rd appearing in Eq. (10) increases as counter angular acceleration increases. Further, when no angular acceleration arises in the sensor 10, the values rb and rd become "0." Thus, the output value Vr of the sensor 10 monotonically increases in association with clockwise angular acceleration about the barycenter G, so that angular acceleration can be measured on the basis of the output value Vr.

As is apparent from the above description, angular acceleration can be measured similarly by combining the GMR elements other than the first X-axis GMR element 11 and the second X-axis GMR element 12; i.e., by combining a GMR element adapted to detect a magnetic field which is applied by the movable coil 32 and increases in intensity in association with occurrence of angular acceleration and whose direction coincides with that in which the GMR element detects a magnetic field, and a GMR element adapted to detect a magnetic field which is applied by the movable coil 32 and decreases in intensity in association with the occurrence of the angular acceleration and whose direction coincides with that in which the GMR element detects a magnetic field. Specifically, angular acceleration can be measured by combining any one of the first X-axis GMR element 11, the second Y-axis GMR element 22, the fourth X-axis GMR element 14, and the third Y-axis GMR element 23 and any one of the second X-axis GMR element 12, the first Y-axis GMR element 21, the third X-axis GMR element 13, and the fourth Y-axis GMR element 24.

Figure 19A:
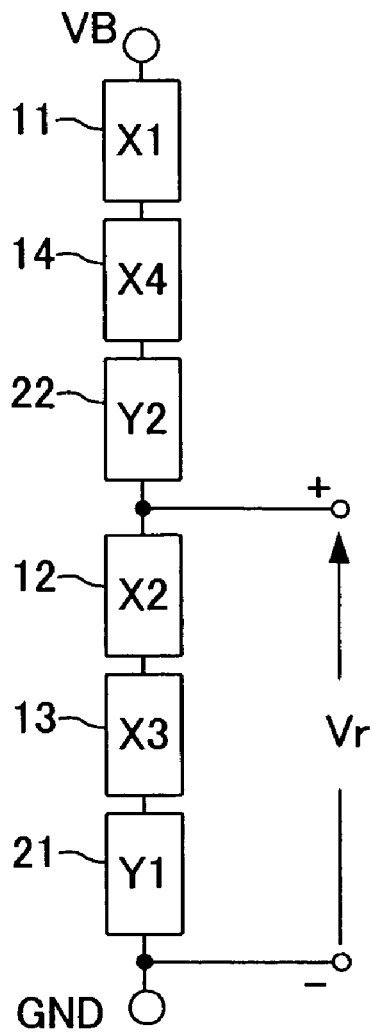
FIG. 19A is another equivalent circuit diagram for measuring angular acceleration.
Figure 19B:
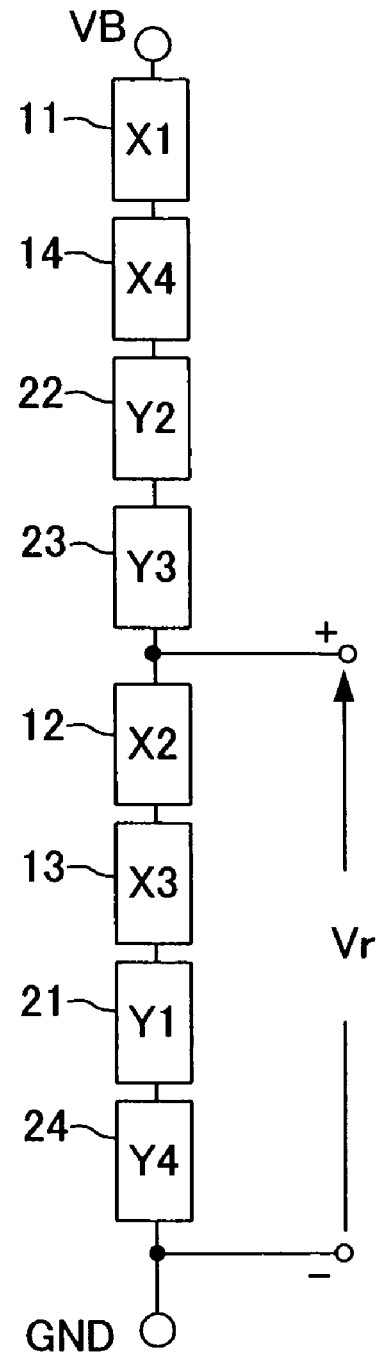
FIG. 19B is still another equivalent circuit diagram for measuring angular acceleration.

Further, angular acceleration can be measured by employment of, for example, the configurations shown in FIGS. 19A and 19B. Specifically, the GMR elements whose resistance decrease in association with occurrence of clockwise angular acceleration are connected in series to form a first group. The GMR elements whose resistance increase in association with occurrence of clockwise angular acceleration are connected in series to form a second group. The first group and the second group are connected in series. The potential difference VB is applied to the opposite ends of the connected first and second groups, and the potential difference between the opposite ends of the first or second group is obtained as the output Vr of the sensor 10.

Figure 20:
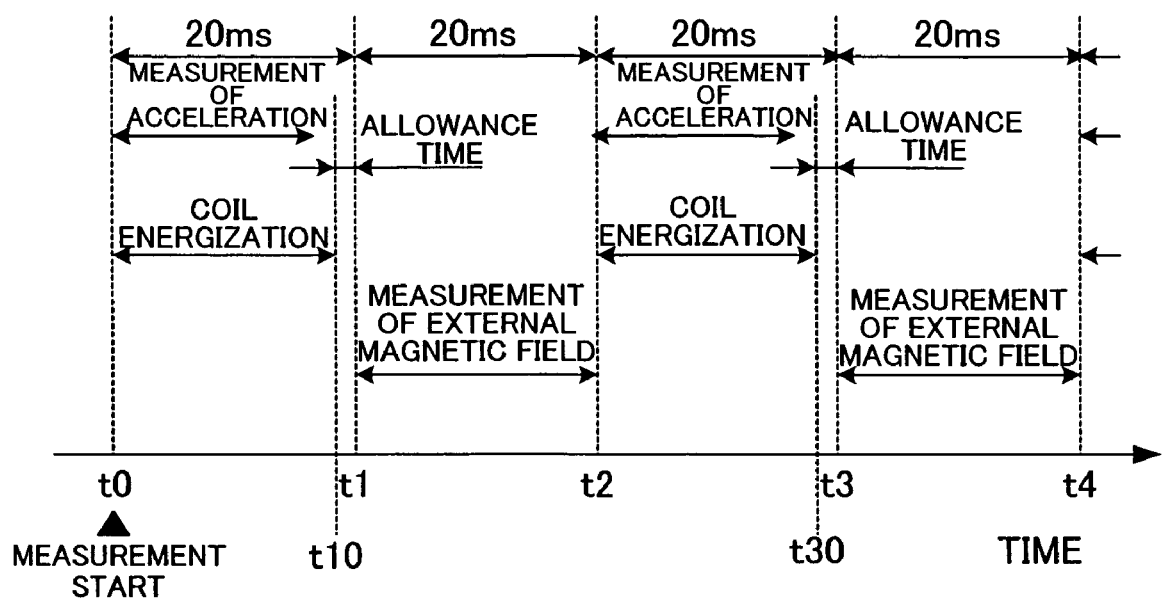
FIG. 20 is a timing chart showing the operation of the sensor shown in FIG. 1 in actually measuring acceleration and an external magnetic field.

Example of Measuring Method:

Next, the operation of the sensor 10 in actually measuring acceleration and an external magnetic field will be described with reference to the timing chart of FIG. 20. Suppose that measurement is started at time t0. At time t0, the circuit section 40 starts to cause the current to flow thorough the movable coil 32 (it starts current application). At the same time, the circuit section 40 measures acceleration along the direction of the X-axis and acceleration along the direction of the Y-axis on the basis of the previously mentioned output values $V_{0x}$ and $V_{0y}$. In other words, the circuit section 40 performs the physical-quantity-measuring step of obtaining acceleration.

Next, at time t10, the circuit section 40 stops making current flow through the movable coil 32. Subsequently, when time t1 (upon completion of the physical-quantity-measuring step) is reached after elapse of an allowance time of, for example, 1 ms, the circuit section 40 starts measuring an external magnetic field (a component of an external magnetic field) along the direction of the X-axis and an external magnetic field (a component of an external magnetic field) along the direction of the Y-axis on the basis of the output values $V_{0x}$ and $V_{0y}$, respectively. In other words, the circuit section 40 performs the external-magnetic-field-measuring step. In the present embodiment, the period between time t0 and time t1 is fixed to 20 ms. The allowance time is required for allowing a magnetic field generated by the movable coil 32 to be completely extinguished after application of current to the movable coil 32 is stopped.

The circuit section 40 completes measurement of an external magnetic field until time t2, which is 20 ms after time t1. At time t2, the circuit section 40 causes start of current application to the movable coil 32 and starts measuring acceleration along the direction of the X-axis and acceleration along the direction of the Y-axis on the basis of the output values $V_{0x}$ and $V_{0y}$, respectively. Subsequently, the circuit section 40 repeats the measurement of acceleration and the measurement of an external magnetic field at predetermined time intervals (20 ms). In the physical-quantity-measuring step, angular acceleration may be measured.

Method for Manufacturing Movable Section:

Next, a method for manufacturing the movable coil section 30 of the sensor 10 will be described with reference to FIGS. 21 to 28. Sectional views of FIGS. 21 to 28 correspond to a sectional view of the sensor 10 cut by a plane extending along line 6-6 of FIG. 1. The sensor 10 of the present embodiment is of an MEMS (Micro-Electro-Mechanical System) type and is manufactured on the basis of a semiconductor process that uses silicon.

Figure 21:
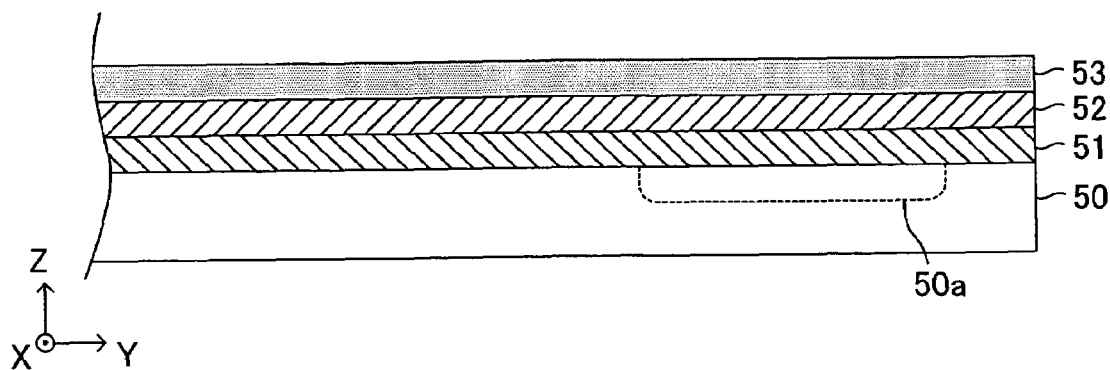
FIG. 21 is a partial, sectional view for explaining a method for manufacturing the movable section of the sensor shown in FIG. 1, depicting a step in the course of manufacture.

(1) First, as shown in FIG. 21, a silicon oxide film ($SiO_2$ film) or a silicon nitride film (SiN film), which serves as an insulating film 51, is formed on a P-type silicon substrate 50. The substrate 50 and the silicon oxide film 51 constitute the previously mentioned substrate 10a. At this time, a high-concentration layer 50a formed of N-type silicon is formed in the substrate 50 at an appropriate position by means of ion implantation. Next, an SOG film (Spin On Glass film or applied silicon oxide film), which serves as a sacrifice layer 52, is formed on the insulating film 51. A silicon oxide film ($SiO_2$ film) or a silicon nitride film (SiN film), which serves as a structural layer 53, is formed on the sacrifice layer 52.

Figure 22:
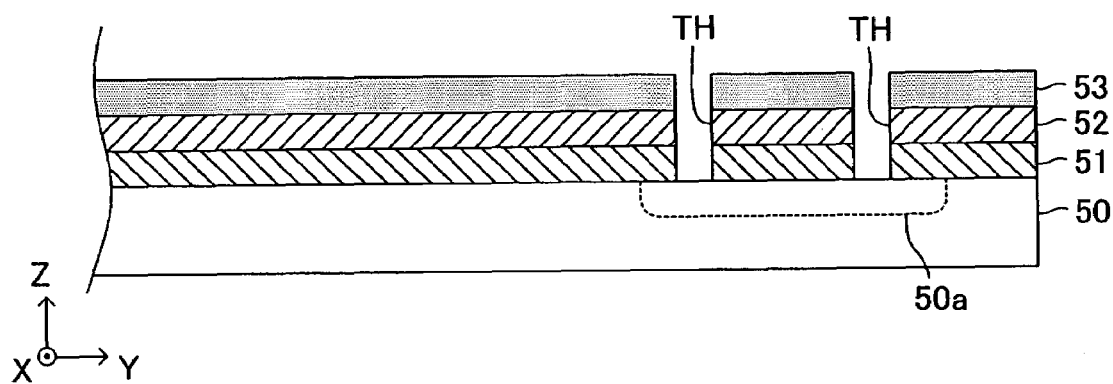
FIG. 22 is a partial, sectional view for explaining a method for manufacturing the movable section of the sensor shown in FIG. 1, depicting a step in the course of manufacture.
Figure 23:
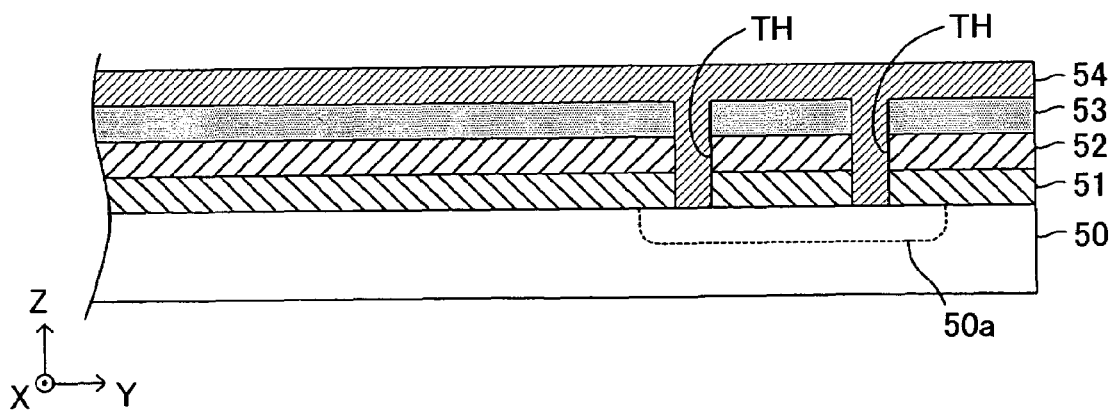
FIG. 23 is a partial, sectional view for explaining a method for manufacturing the movable section of the sensor shown in FIG. 1, depicting a step in the course of manufacture.
Figure 24:
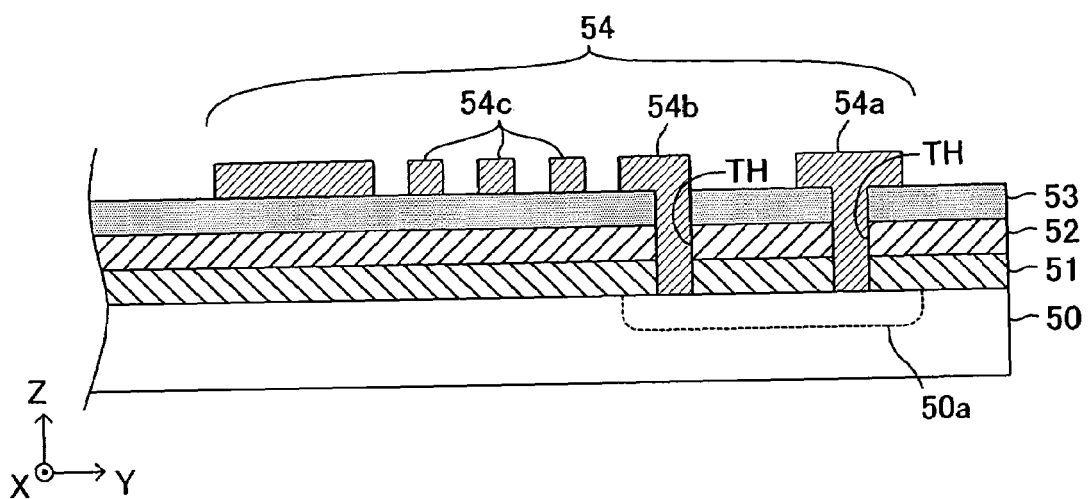
FIG. 24 is a partial, sectional view for explaining a method for manufacturing the movable section of the sensor shown in FIG. 1, depicting a step in the course of manufacture.

(2) Next, as shown in FIG. 22, connection holes TH are formed at appropriate positions in such a manner as to extend through the insulating film 51, the sacrifice layer 52, and the structural layer 53. As shown in FIG. 23, a conductive layer 54 is formed by use of polysilicon (doped polysilicon containing an impurity, such as phosphorus or boron) or tungsten. As shown in FIG. 24, the conductive layer 54 undergoes patterning so as to assume the previously mentioned shape of the movable coil 32. In FIG. 24, a conductive layer 54a is formed, by patterning, at an edge portion of the conductive layer 54 with respect to the positive direction of the Y-axis and serves as the previously mentioned coil connection pad 34a. A conductive layer 54b formed by patterning serves as the previously mentioned support portion 33a2. The conductive layer 54a and the conductive layer 54b are electrically connected by means of the high-concentration layer 50a. A conductive layer 54c serves as an upper portion of the spring portion 33a1.

Figure 25:
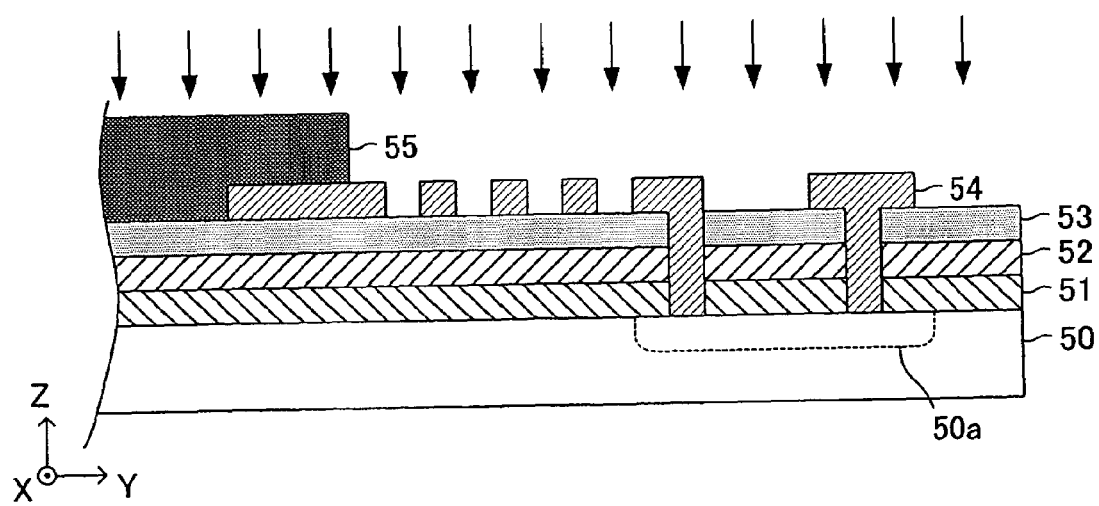
FIG. 25 is a partial, sectional view for explaining a method for manufacturing the movable section of the sensor shown in FIG. 1, depicting a step in the course of manufacture.

(3) Next, as shown in FIG. 25, a resist film 55 is formed on and above a region of the structural layer 53 that will serve as the previously mentioned weight section 31. While a portion of the structural layer 53 immediately under the conductive layer 54 is left intact, an unnecessary portion of the structural layer 53 is removed by a dry etching (anisotropic dry etching) process that uses $CHF_3$ or $CF_4$.

Figure 26:
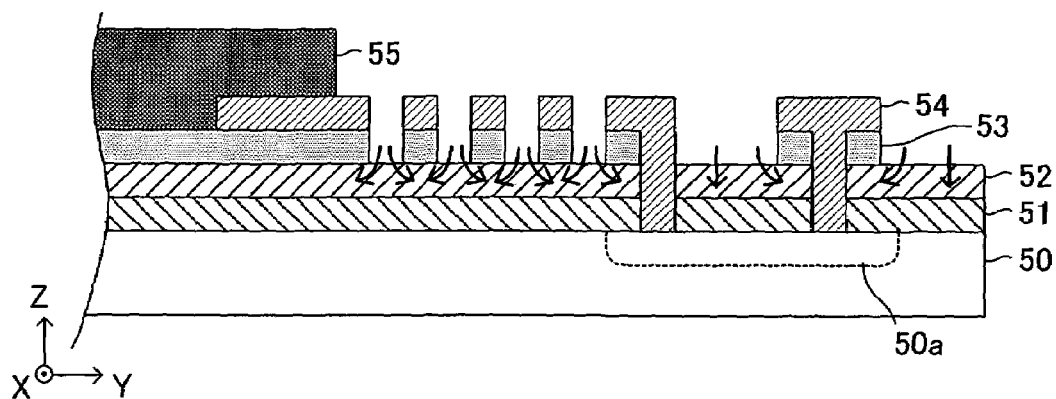
FIG. 26 is a partial, sectional view for explaining a method for manufacturing the movable section of the sensor shown in FIG. 1, depicting a step in the course of manufacture.
Figure 27:
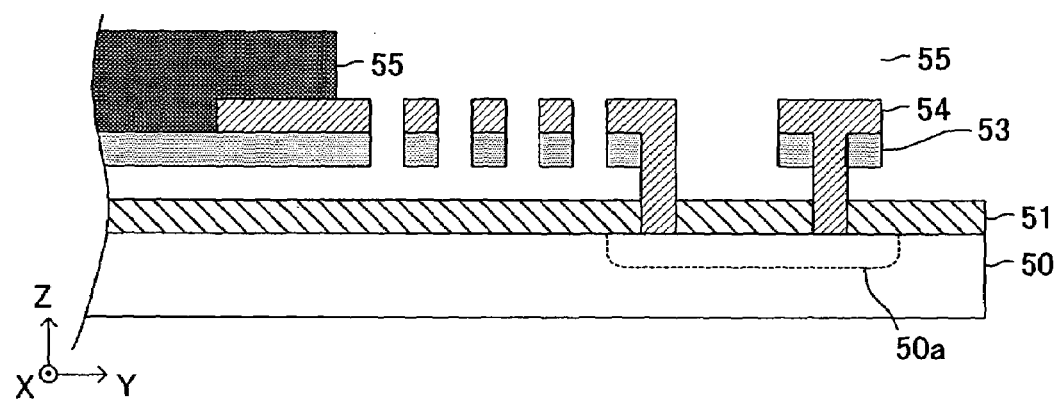
FIG. 27 is a partial, sectional view for explaining a method for manufacturing the movable section of the sensor shown in FIG. 1, depicting a step in the course of manufacture.

(4) Next, as shown in FIG. 26, the sacrifice layer 52 is removed by a wet etching process that uses buffered hydrofluoric acid (BHF) or dilute hydrofluoric acid (HF). Since the etching rate of the sacrifice layer 52 is very high, as shown in FIG. 27, the entire sacrifice layer 52 is removed by the wet etching process, while the insulating film 51 remains almost intact.

Figure 28:
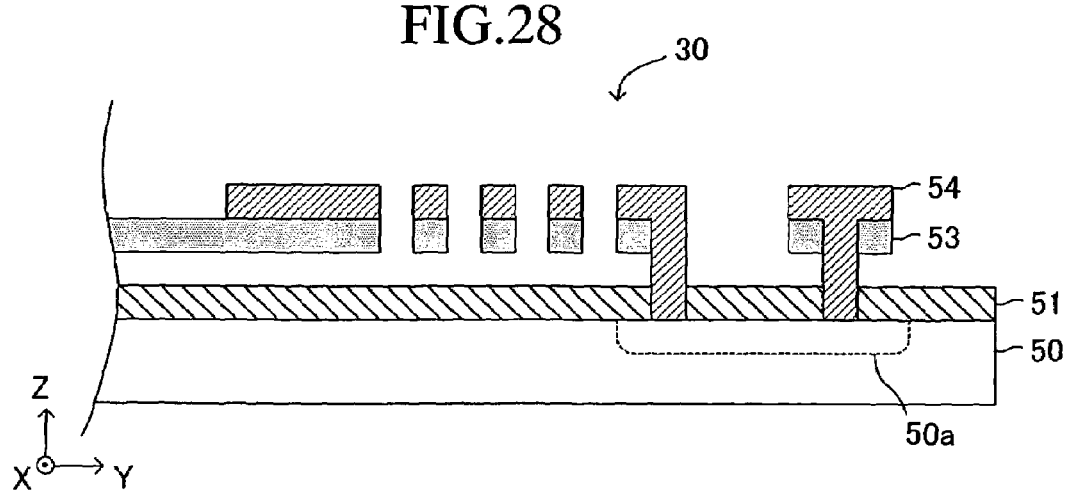
FIG. 28 is a partial, sectional view for explaining a method for manufacturing the movable section of the sensor shown in FIG. 1, depicting a step in the course of manufacture.

(5) Finally, the resist film 55 is removed. As a result, as shown in FIG. 28, the movable coil section 30 is completed.

As described above, with the sensor 10 according to an embodiment of the present invention and the method for measuring a physical quantity by use of the sensor 10, an external magnetic field and acceleration or the like can be measured or detected by use of the magnetic detection elements and the movable coil.

Figure 29:
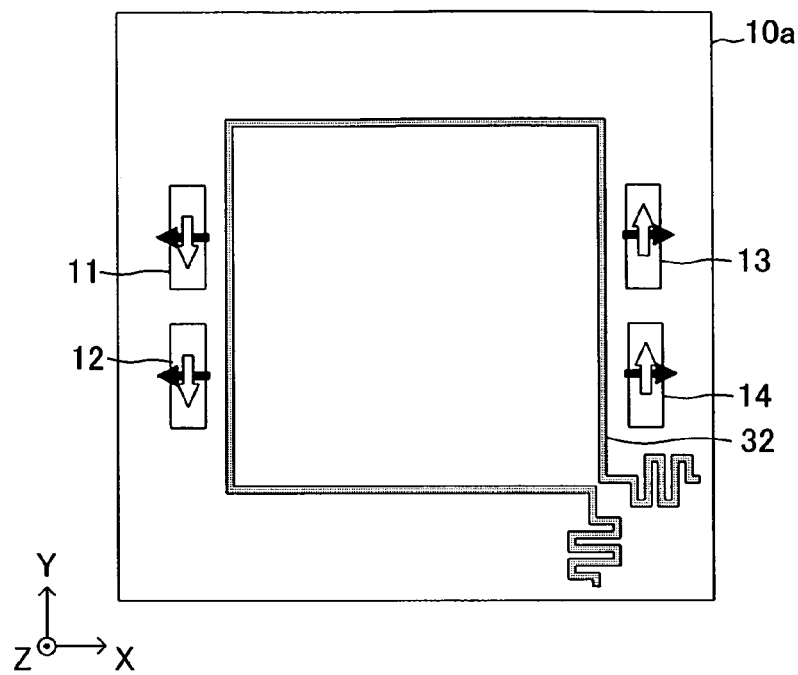
FIG. 29 is a schematic plan view of a sensor according to another embodiment of the present invention.

The present invention is not limited to the above embodiments, but may be modified as appropriate without departing from the scope of the invention. For example, the sensor 10 includes the first to fourth X-axis GMR elements 11 to 14 adapted to detect a magnetic field in the direction of the X-axis, and the first to fourth Y-axis GMR elements 21 to 24 adapted to detect a magnetic field in the direction of the Y-axis, and is configured so as to detect an external magnetic field and acceleration in the two mutually orthogonal axial directions. However, as shown in the schematic plan view of FIG. 29, the sensor may employ only the first to fourth X-axis GMR elements 11 to 14 as magnetic detection elements and be configured so as to detect an external magnetic field and acceleration in the direction of the X-axis.

Figure 30:
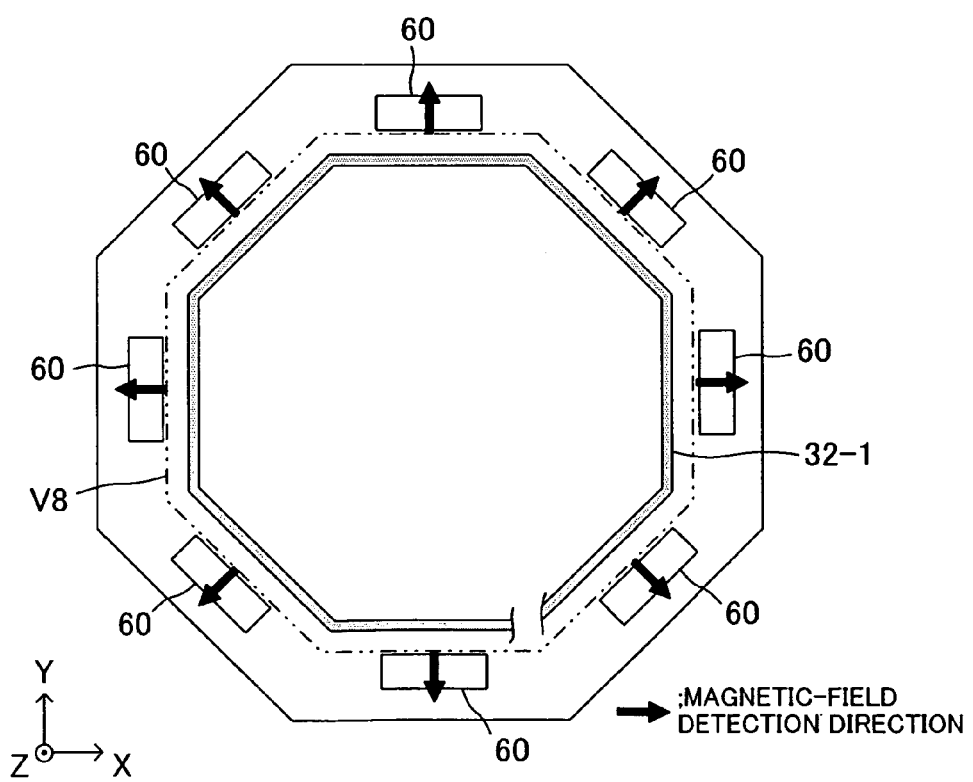
FIG. 30 is a schematic plan view of a sensor according to still another embodiment of the present invention.

In the sensor 10, the GMR elements are disposed in the vicinity of corresponding central portions of the first sides (which extend along the direction of the Y-axis) of an imaginary regular polygon; specifically, the imaginary square VS, and in the vicinity of corresponding central portions of the second sides (which extend along the direction of the X-axis) extending along a direction perpendicularly intersecting the first sides, such that each of the GMR elements detects a magnetic field in a direction perpendicularly intersecting the associated side (i.e., such that each of the GMR elements exhibits a characteristic value whose magnitude corresponds to a component of a magnetic field along a direction perpendicularly intersecting the associated side). The imaginary regular polygon is not limited to square. For example, as shown in the schematic plan view of FIG. 30, the imaginary regular polygon may be a regular octagon. In this case, preferably, the GMR elements; specifically, magnetic detection elements 60, are disposed in the vicinity of corresponding central portions of the sides of the imaginary regular octagon V8 such that each of the magnetic detection elements detects a magnetic field in a direction perpendicularly intersecting the associated side, and a movable coil 32-1 assumes the shape of a regular octagon similar to or identical with the imaginary regular octagon V8.

Further, the sensor 10 makes a changeover with respect to a connection relation among the GMR elements in accordance with a measuring item. However, an external magnetic field, acceleration, or a like item may be obtained as follows: the GMR elements are individually measured for resistance, and calculation is performed on the basis of the measured resistances.

The sensor 10 employs a GMR element (giant magnetoresistance element) as a magnetic detection element that exhibits a characteristic value whose magnitude corresponds to a magnetic field applied thereto. However, a magnetic detection element to be employed may be, for example, an anisotropic magnetoresistance element (AMR element), a tunnel magnetoresistance element (TMR element), a magnetic impedance element (MI element), a flux gate sensor, or a Hall element.

In the sensor 10, the first to fourth X-axis GMR elements 11 to 14, which collectively serve as the first magnetic detection element, are fixed on the substrate 10a so as to exhibit a characteristic value whose magnitude corresponds to a component of a magnetic field along the direction of the X-axis (first direction), and the first to fourth Y-axis GMR elements 21 to 24, which collectively serve as the second magnetic detection element, are fixed on the substrate 10a so as to exhibit a characteristic value whose magnitude corresponds to a component of the magnetic field along the direction of the Y-axis (second direction) intersecting the direction of the X-axis (first direction) at an angle of 90 degrees. However, the second magnetic detection element may be fixed on the substrate 10a so as to exhibit a characteristic value whose magnitude corresponds to a component of the magnetic field along the second direction intersecting the first direction at a predetermined angle of other than 90 degrees.

What is claimed is:

1. A sensor comprising:
    a substrate;
    a plurality of magnetic detection elements, at least one of the magnetic detection elements being fixed on the substrate and exhibiting a characteristic value whose magnitude corresponds to a magnetic field applied thereto; and
    a movable coil supported movably on the substrate via a support member and applying to the magnetic detection elements a magnetic field generated through application of electric current to the movable coil;
    the sensor outputting a value corresponding to a characteristic value exhibited by at least one of the plurality of magnetic detection elements,wherein the movable coil is polygonally-shaped and at least one of the magnetic detection elements is disposed in the vicinity of central portion of one of sides of the polygon-shaped movable coil.

2. The sensor according to claim 1, further comprising electric-current control means for controlling electric current flowing through the movable coil.

3. The sensor according to claim 1, wherein at least one of the other of the magnetic detection elements is disposed in the vicinity of central portion of one of the other sides of the polygon-shaped movable coil.

4. The sensor according to claim 1, wherein at least two of the magnetic detection elements are disposed opposite to each other and the movable coil is disposed between the two of the magnetic detection elements.

5. The sensor according to claim 1, wherein the magnetic detection elements are in a full bridge connection.

6. A method for measuring a physical quantity for measuring, by use of a sensor, at least either acceleration or angular acceleration of the sensor or an object on which the sensor is fixed, the sensor including a substrate, a plurality of magnetic detection elements, at least one of the magnetic detection elements being fixed on the substrate and exhibiting a characteristic value whose magnitude corresponds to a magnetic field applied thereto, and a movable coil supported movably on the substrate via a support member, the method comprising:
    applying electric current to the movable coil to generate a magnetic field, and measuring in this state a value corresponding to a characteristic value exhibited by the magnetic detection elements as at least either the acceleration or the angular acceleration, wherein the movable coil is polygonally-shaped and at least one of the magnetic detection elements is disposed in the vicinity of central portion of one of sides of the polygon-shaped movable coil.

7. The method according to claim 6, wherein at least one of the other of the magnetic detection elements is disposed in the vicinity of central portion of one of the other sides of the polygon-shaped movable coil.

8. The method according to claim 6, wherein at least two of the magnetic detection elements are disposed opposite to each other and the movable coil is disposed between the two of the magnetic detection elements.

9. The method according to claim 6, wherein the magnetic detection elements are in a full bridge connection.

10. A sensor comprising:
    a substrate having a main surface;
    a first magnetic detection element fixed om the main surface of the substrate so as to exhibit a characteristic value whose magnitude corresponds to a component of a magnetic field along a first direction on the main surface of the substrate;
    a second magnetic detection element fixed on the main surface of the substrate so as to exhibit a characteristic value whose magnitude corresponds to a component of the magnetic field along a second direction intersecting the first direction at a predetermined angle on the main surface of the substrate; and
    a movable coil supported on the substrate via a support member so as to be movable in a plane in parallel with the main surface of the substrate and applying to the first and second magnetic detection elements a magnetic field generated through application of electric current to the movable coil; and
    the sensor being configured so as to output a value corresponding to a characteristic value exhibited by the first magnetic detection element and a value corresponding to a characteristic value exhibited by the second magnetic detection element.

11. The sensor according to claim 10, wherein the predetermined angle is 90 degrees.

12. The sensor according to claim 11, further comprising electric-current control means for controlling electric current flowing through the movable coil.

13. The sensor according to calim 10, further comprising electric-current control means for controlling electric current flowing through the movable coil.

14. A sensor comprising:
    a substrate having a main surface;
    a first magnetic detection element fixed on the main surface of the substrate; and
    a second magnetic detection element fixed on the main surface of the substrate.
    the sensor outputting a value to a characteristic value exhibited by the first magnetic detection element and a value corresponding to a characteristic value exhibited by the second magnetic detection element;
    the first magnetic detection element being disposed in the vicinity of a central portion of a first side, which is one of the sides constituting and imaginary polygon formed on the main surface of the substrate, and being configured so as to exhibit a characteristic value whose magnitude corresponds to a component of a magnetic field along a direction perpendicularly intersecting the first side;
    the second magnetic detection element being disposed in the vicinity of a central portion of a second side, which is one of sides constituting the imaginary polygon formed on the main surface of the substrate and which intersects the first side, and being configured so as to exhibit a characteristic value whose magnitude corresponds to a component of the magnetic field along a direction perpendicularly intersecting the second side; and
    the sensor further comprising a movable coil having a shape identical with or similar to the imaginary polygon, the movable coil being supported on the substrate via a support member so as to be movable in a plane in parallel with the main surface of the substrate, the movable coil, at the time of the sensor being in a stationary condition, being held in its position where a barycenter of the movable coil coincides with that of the imaginary polygon and where sides of the movable coil are in parallel with those of the imaginary polygon, the movable coil applying to the first and second magnetic detection elements of a magnetic field generated through application of electric current to the movable coil.

15. The sensor according to claim 14, wherein the imaginary polygon is a regular polygon.

16. The sensor according to claim 15, wherein the imaginary polygon is a square.

17. The sensor according to claim 16, further comprising electric-current control means for controlling electric current flowing through the movable coil.

18. The sensor according to claim 15, further comprising electric-current control means for controlling electric current flowing through the movable coil.

19. The sensor according to claim 14, further comprising electric-current control means for controlling electric current flowing through the movable coil.

20. A measuring method for measuring, by use of a sensor, an external magnetic field applied to the sensor and at least either acceleration or angular acceleration of the sensor or an object on which the sensor is fixed, the sensor including a substrate, a magnetic detection element fixed on the substrate and exhibiting a characteristic value whose magnitude corresponds to a magnetic field applied thereto, and a movable coil supported movably on the substrate via a support member, the method comprising:

and external-magnetic-field-measuring step of stopping application of electric current to the movable coil so as to extinguish the magnetic field generated by the movable coil, and obtaining in this state a value corresponding to a characteristic value exhibited by the magnetic detection element as an intensity of the external magnetic field applied to the sensor; and a physical-quantity-measuring step of applying electric current to the movable coil so as to generate the magnetic field by the movable coil, and obtaining in this state a value corresponding to a characteristic value exhibited by the magnetic detection element as at least either the acceleration or the angular acceleration.

21. The measuring method according to claim 20, wherein the external-magnetic-field-measuring step and the physical-quantity-measuring step are performed alternately and repeatedly at predetermined time intervals, and the external-magnetic-field-measuring step is started after elapse of an allowance time subsequent to stoppage of application of electric current to the movable coil upon completion of the physical-quantity-measuring step.

22. A sensor comprising:
a substrate having a main surface;
a first X-axis magnetic detection element fixed on the main surface of the substrate;
a second X-axis magnetic detection element fixed on the main surface of the substrate;
a third X-axis magnetic detection element fixed on the main surface of the substrate;
a fourth X-axis magnetic detection element fixed on the main surface of the substrate;
wherein the first X-axis magnetic detection element being disposed in the vicinity of a central portion of a first side, which is one of sides constituting an imaginary square formed on the main surface of the substrate, and being configured so as to exhibit a characteristic value whose magnitude corresponds to a component of a magnetic field along an X-axis positive direction which perpendicularly intersects the first side;
the second X-axis magnetic detection element being disposed in the vicinity of a central portion of the first side constituting the imaginary square on the main surface of the substrate, and being configured so as to exhibit a characteristic value whose magnitude corresponds to the component of the magnetic field along the X-axis positive direction;
the third X-axis magnetic detection element being disposed in the vicinity of a central portion of a second side facing the first side of the imaginary square on the main surface of the substrate, and being configured so as to exhibit a characteristic value whose magnitude corresponds to a component of the magnetic field along an X-axis negative direction which intersects the second side;
the fourth X-axis magnetic detection element being disposed in the vicinity of a central portion of the second side of the imaginary square on the main surface of the substrate, and being configured so as to exhibit a characteristic value whose magnitude corresponds to the component of the magnetic field along the X-axis negative direction; and
the sensor further comprising:
a movable coil having a shape identical with or similar to the imaginary square, the movable coil being supported on the substrate via a support member so as to be movable in a plane in parallel with the main surface of the substrate, the movable coil, at the time of the sensor being in a stationary condition, being held in its initial position where a barycenter of the movable coil coincides with that of the imaginary square and where sides of the movable coil are in parallel with those of the imaginary square, the movable coil applying to the first, second, third, and fourth magnetic detection elements a magnetic field generated through application of electric current to the movable coil.

* * * * *